(12) United States Patent
Takahashi et al.

(10) Patent No.: US 8,936,473 B2
(45) Date of Patent: Jan. 20, 2015

(54) CONNECTOR

(71) Applicant: Japan Aviation Electronics Industry, Limited, Shibuya-ku, Tokyo (JP)

(72) Inventors: Takeshi Takahashi, Tokyo (JP); Yu Tatebe, Tokyo (JP)

(73) Assignee: Japan Aviation Electronics Industry, Limited, Tokyo (JP)

( * ) Notice: Subject to any disclaimer, the term of this patent is extended or adjusted under 35 U.S.C. 154(b) by 77 days.

(21) Appl. No.: 13/900,477

(22) Filed: May 22, 2013

(65) Prior Publication Data

US 2013/0344741 A1 Dec. 26, 2013

(30) Foreign Application Priority Data

Jun. 22, 2012 (JP) ................................. 2012-140678

(51) Int. Cl.
| | |
|---|---|
| H01R 12/00 | (2006.01) |
| H01R 24/00 | (2011.01) |
| H01R 12/71 | (2011.01) |
| H05K 3/32 | (2006.01) |

(52) U.S. Cl.
CPC .............. *H01R 24/00* (2013.01); *H01R 12/714* (2013.01); *H05K 3/32* (2013.01); *H05K 2201/10378* (2013.01); *H05K 2201/10962* (2013.01)
USPC .......................................................... 439/71

(58) Field of Classification Search
USPC .............................................. 439/71, 331, 66
See application file for complete search history.

(56) References Cited

U.S. PATENT DOCUMENTS 6,012,929 A * 1/2000 Matsumura ..................... 439/70

FOREIGN PATENT DOCUMENTS

JP 2010-182551 A 8/2010

* cited by examiner

*Primary Examiner* — Xuong Chung Trans

(74) *Attorney, Agent, or Firm* — Holtz, Holtz, Goodman & Chick PC

(57) ABSTRACT

A connector capable of improving the contact stability. Linear cores of contact members and wires of an insulating holder are weaved to thereby form a net. Conductive path portions of the contact members are disposed such that they extend through a mesh.

18 Claims, 38 Drawing Sheets

CONNECTOR

BACKGROUND OF THE INVENTION

1. Field of the Invention

This invention relates to a connector.

2. Description of the Related Art

Conventionally, as shown in FIGS. 30 to 34, there has been proposed a connector 901 that electrically connects between four first printed boards 921 and one second printed board 922 (see Japanese Laid-Open Patent Publication (Kokai) No. 2010-182551 (Paragraphs 0032, 0033, 0035 to 0039, and 0047 to 0050, and FIGS. 1, 3, and 7 to 9). Note that FIGS. 30, 31, 32, 33, and 34 correspond to FIGS. 1, 3, 7, 8, and 9 in Japanese Laid-Open Patent Publication (Kokai) No. 2010-182551, respectively. However, reference numerals in the figures are changed, and some of them are deleted.

The connector 901 includes a plurality of elastic conductors 950 and an insulating plate 930 that holds the plurality of elastic conductors 950.

The insulating plate 930 has a substantially rectangular shape, and has four rectangular areas 930E1, 930E2, 930E3, and 930E4, as shown in FIG. 31. The areas 930E1, 930E2, 930E3, and 930E4 each are an area on which one first printed board 921 is disposed. The areas 930E1, 930E2, 930E3, and 930E4 of the insulating plate 930 are each formed with a plurality of slits 931 at equally-spaced intervals, as shown in FIGS. 32 and 33. Each slit 931 of the insulating plate 930 has an inner surface formed with a plurality of protrusions 931a (see FIGS. 32 and 33). A plurality of positioning protrusions 970 are integrally formed with the insulating plate 930 at respective locations close to four corners of the areas 930E1, 930E2, 930E3, and 930E4 of the insulating plate 930.

As shown in FIG. 32, each elastic conductor 950 includes an elastic body 951, an FPC 952, and a metallic column 953.

The elastic body 951 is substantially long plate-shaped. The elastic body 951 has a rear surface formed with a plurality of recesses 951b in which the protrusions 931a of the insulating plate 930 are fitted, respectively (see FIGS. 32 and 33).

As shown in FIG. 32, the FPC 952 includes an insulating film 952a and a plurality of conducting paths 952b. The insulating film 952a is affixed to a front side (left side surface of the elastic body 951, as viewed in FIG. 32) of the elastic body 951.

The metallic column 953 is buried in the elastic body 951. The metallic column 953 extends in a longitudinal direction of the elastic body 951, and has part thereof exposed on a rear surface of the elastic body 951 (see FIG. 32).

The plurality of elastic conductors 950 are inserted in the slits 931 of the insulating plate 930, respectively (see FIGS. 32 and 33). When each elastic conductor 950 is inserted in an associated one of the slits 931, an associated one of the protrusions 931a of the insulating plate 930 is fitted in an associated one of the recesses 951b of the elastic conductors 950, and hence the elastic conductor 950 is prevented from being easily removed from the associated slit 931.

The connector 901 is used in the following manner:

First, as shown in FIG. 34, the connector 901 is disposed on the second printed board 922. At this time, by inserting positioning pins 922c of the second printed board 922 in respective positioning holes 942 of the connector 901, the connector 901 is positioned with respect to the second printed board 922.

Next, as shown in FIG. 34, the four first printed boards 921 are arranged on a first board-disposing surface 930A (the areas 930E1, 930E2, 930E3, and 930E4) of the connector 901, respectively. The four first printed boards 921 are positioned by the positioning protrusions 970 with respect to the first board-disposing surface 930A of the connector 901.

Finally, screws inserted through respective screw insertion holes of a heat sink, not shown, arranged on the first printed boards 921 are screwed into screw holes of a metallic plate, not shown, arranged below the second printed board 922. The heat sink and the metallic plate sandwich the first printed boards 921 and the second printed board 922 via the connector 901, whereby mechanical and electrical connection between the first printed boards 921 and the second printed board 922 is maintained.

To realize narrowing of a pitch between the elastic conductors 950 of the above-described connector 901, it is only necessary to reduce an arrangement pitch of the slits 931 of the insulating plate 930, and reduce the thickness of each partition wall 932 (see FIGS. 32 and 33) located between the slits 931.

However, the insulating plate 930 and the partition walls 932 are integrally molded of resin, and hence if each partition wall 932 is reduced in thickness, this makes it difficult to perform resin molding, and even if the insulating plate 930 and the partition walls 932 can be molded of resin with high accuracy, the strength of each partition wall 932 is reduced. As a consequence, when the first printed boards 921 and the second printed board 922 are sandwiched by the heat sink and the metallic plate via the connector 901, if a central portion of the second printed board 922 is warped, this increases a difference in the amount of deformation of ones of the elastic conductors 950 located toward the central portion of the second printed board 922 and the amount of deformation of ones of the elastic conductors 950 located toward the periphery of the central portion of the second printed board 922, which may cause reduction of the contact stability.

SUMMARY OF THE INVENTION

The present invention has been made in view of these circumstances, and an object thereof is to provide a connector that is capable of improving the contact stability.

To attain the above object, the present invention provides a connector that electrically connects between a first object to be connected and a second object to be connected, comprising an insulating holder including a plurality of linear insulating portions that are arranged parallel to each other, and holding portions that hold opposite ends of each of the plurality of linear insulating portions, and a plurality of contact members that are sandwiched between the first object to be connected and the second object to be connected and are elastically deformed therebetween, the plurality of contact members being held by the insulating holder, each contact member including a linear core that is disposed in a direction orthogonal to a direction in which the linear insulating portions extend, and a plurality of conductive path portions provided on the linear core at predetermined spaced intervals, for electrically connecting between first terminal portions formed on the first object to be connected and second terminal portions formed on the second object to be connected, respectively, wherein a net is formed by arranging the plurality of linear insulating portions alternatingly differently around the linear core of each contract member.

Preferably, the linear insulating portions are more flexible than the linear core.

Preferably, each linear insulating portion is a wire.

More preferably, each linear insulating portion has a substantially circular cross-section.

Preferably, the plurality of linear insulating portions are formed by blanking a flexible film such that a plurality of slits arranged in parallel to each other are formed therethrough.

Preferably, each linear insulating portion extends between adjacent ones of the conductive path portions.

More preferably, one of the adjacent ones of the linear insulating portions is arranged around all of the linear cores sequentially such that the one is first passed on one of the linear cores, from above, and is next passed on another one of the linear cores adjacent to the one of the linear cores, from below, and the other of the adjacent ones of the linear insulating portions is arranged around the all of the linear cores sequentially such that the other is first passed on the one of the linear cores, from below, and is next passed on the another one of the linear cores adjacent to the one of the linear cores, from above.

Preferably, the conductive path portions are disposed in a manner extending through a mesh of the net.

Preferably, the connector further comprises an outer frame to which the holding portions are fixed.

More preferably, tension is applied to the linear insulating portions.

According to the present invention, it is possible to provide a connector that is capable of improving the contact stability.

The above and other objects, features and advantages of the present invention will become more apparent from the following detailed description taken in conjunction with the accompanying drawings.

DETAILED DESCRIPTION OF THE PREFERRED EMBODIMENT

Figure 1:
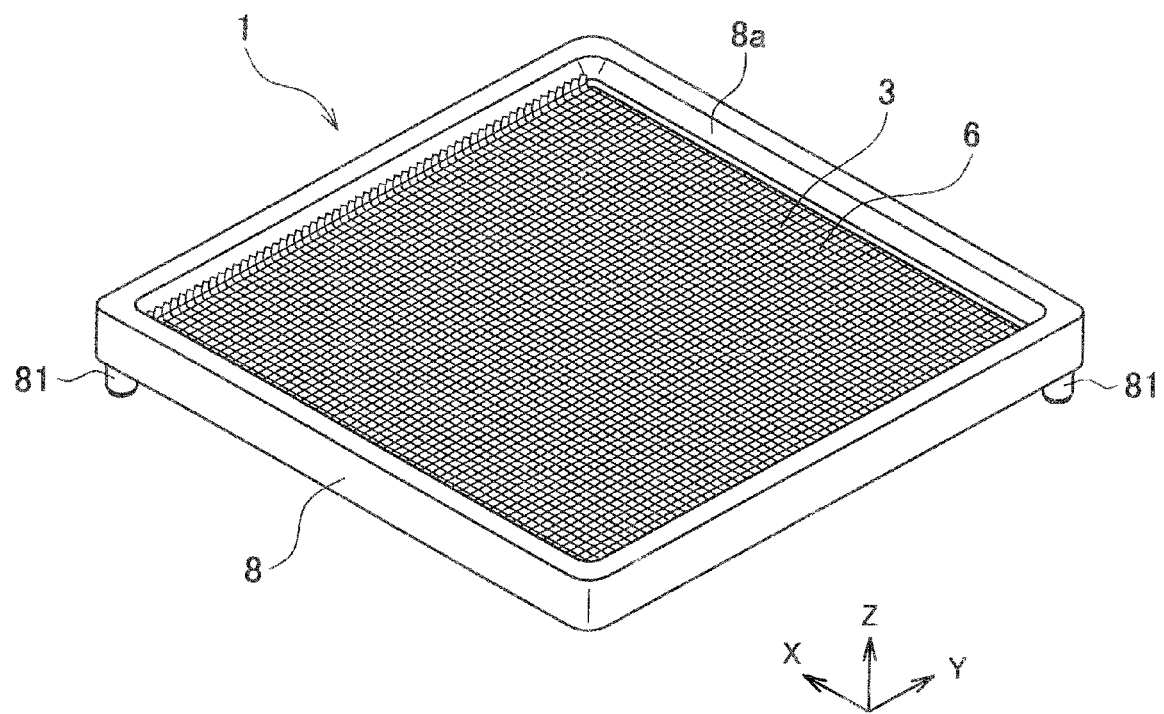
FIG. 1 is a perspective view of a connector according to a first embodiment of the present invention.

The present invention will now be described in detail with reference to the drawings showing preferred embodiments thereof.

First, a description will be given of a connector according to a first embodiment of the present invention with reference to FIGS. 1 to 20.

As shown in FIGS. 1 to 5, the connector, denoted by reference numeral 1, comprises a plurality of contact members 3, an insulating holder 6 for holding the plurality of contact members 3, and an insulating frame (outer frame) 8 to which the insulating holder 6 is fixed. The connector 1 is, for example, a connector for electrically connecting between a multicore IC package (first object to be connected) 22, such as a CPU, and a printed board (second object to be connected) 21 (see FIG. 20). The plurality of contact members 3 are sandwiched between the IC package 22 and the printed board 21 and are elastically deformed.

Figure 5:
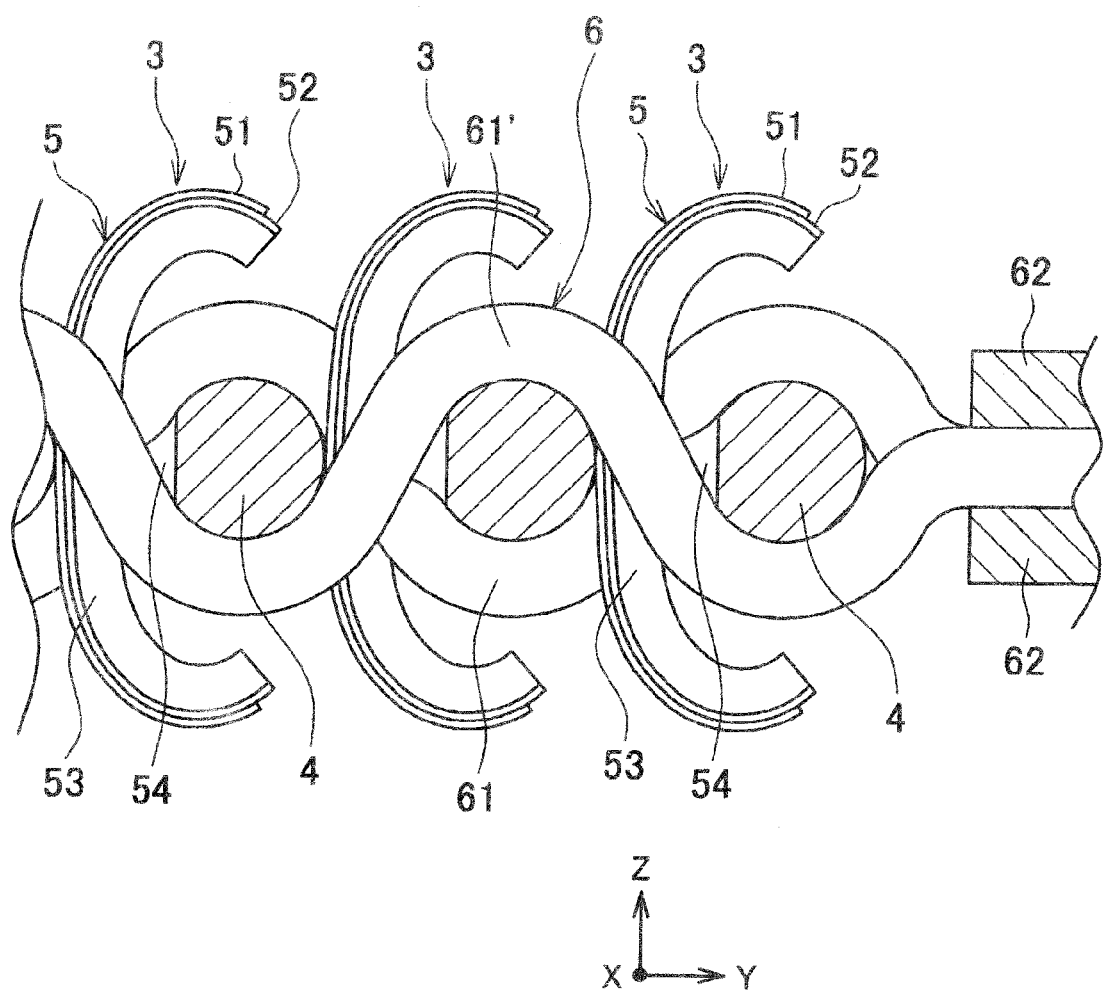
FIG. 5 is an enlarged view of a cross-section of the portion A in FIG. 3, as viewed from a side.

The insulating holder 6 comprises a plurality of wires (linear insulating portions) 61 and 61' and a plurality of resin tapes (holding portions) 62 (see FIG. 5). The plurality of wires 61 and 61' are arranged parallel to each other. The wires 61 and 61' each have a circular cross-section. The resin tapes 62 hold opposite ends of the plurality of wires 61 and 61'.

The wires 61 and 61' each are more flexible than a linear core 4, referred to hereinafter. However, the wires 61 and 61' are higher in breaking strength against bending than the linear core 4. The wires 61 and 61' are each formed of an insulating material mainly composed of polyimide. The resin tapes 62 are, for example, resin tapes suitable for laser welding. Adhesive tapes may be used in place of the resin tapes.

Figure 6:
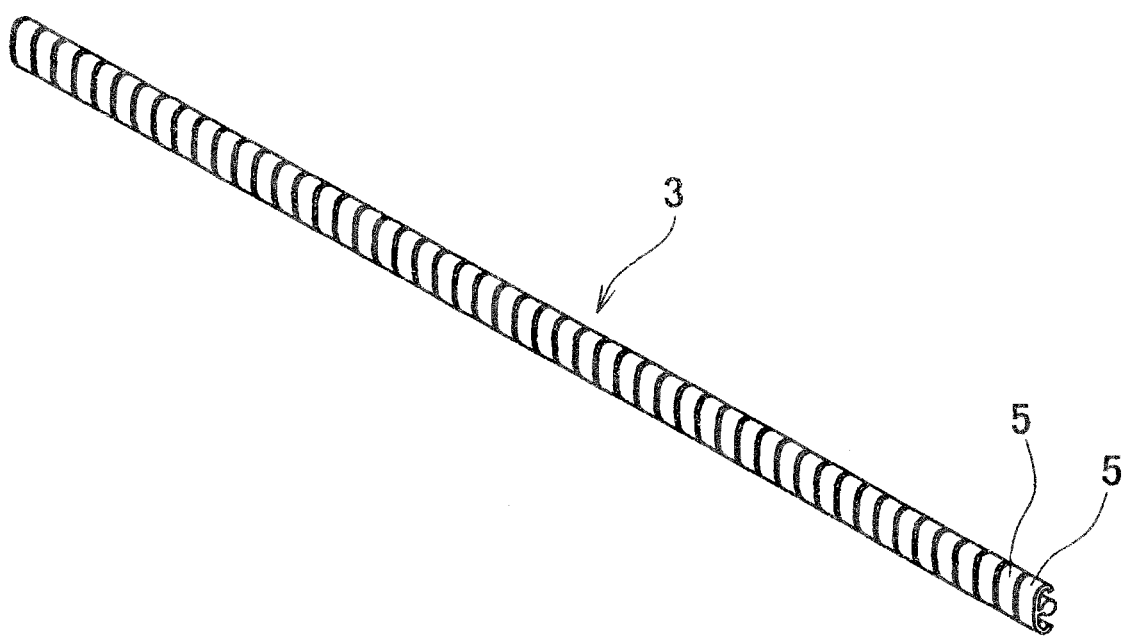
FIG. 6 is a perspective view of a contact member of the connector shown in FIG. 1.
Figure 7:
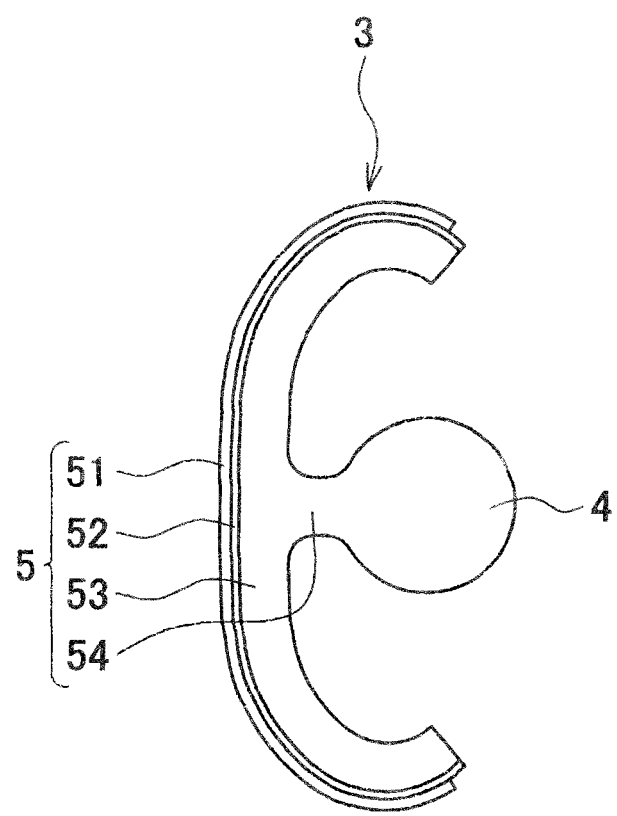
FIG. 7 is an enlarged side view of the contact member shown in FIG. 6.

As shown in FIGS. 6 and 7, each contact member 3 includes the linear core 4 and a plurality of conductive path portions 5. The linear core 4 extends in a direction (transverse direction X) orthogonal to a direction (longitudinal direction Y) in which the wires 61 and 61' extend (see FIG. 16). The linear core 4 has a substantially circular cross-section.

As shown in FIG. 7, each conductive path portion 5 includes a conductive film 51, an insulating film 52, a flat spring portion 53, and a connection portion 54.

Each flat spring portion 53 has a substantially C-shaped cross-section. The flat spring portions 53 are connected to the linear core 4 via the connection portions 54, respectively, at equally-spaced intervals in the longitudinal direction of the linear core 4. The linear core 4, the flat spring portions 53, and the connection portions 54 are integrally molded of an insulating material mainly composed of e.g. polyimide.

Each conductive film 51 is affixed to an associated one of the flat spring portions 53 via the insulating film 52. The insulating film 52 is a film mainly composed of e.g. polyimide, which has a thickness of several μm. The conductive film 51 covers a front surface (left surface as viewed in FIG. 7), an upper surface (upper surface as viewed in FIG. 7), and a lower surface (lower surface, as viewed in FIG. 7) of the plate spring 53.

Figure 8:
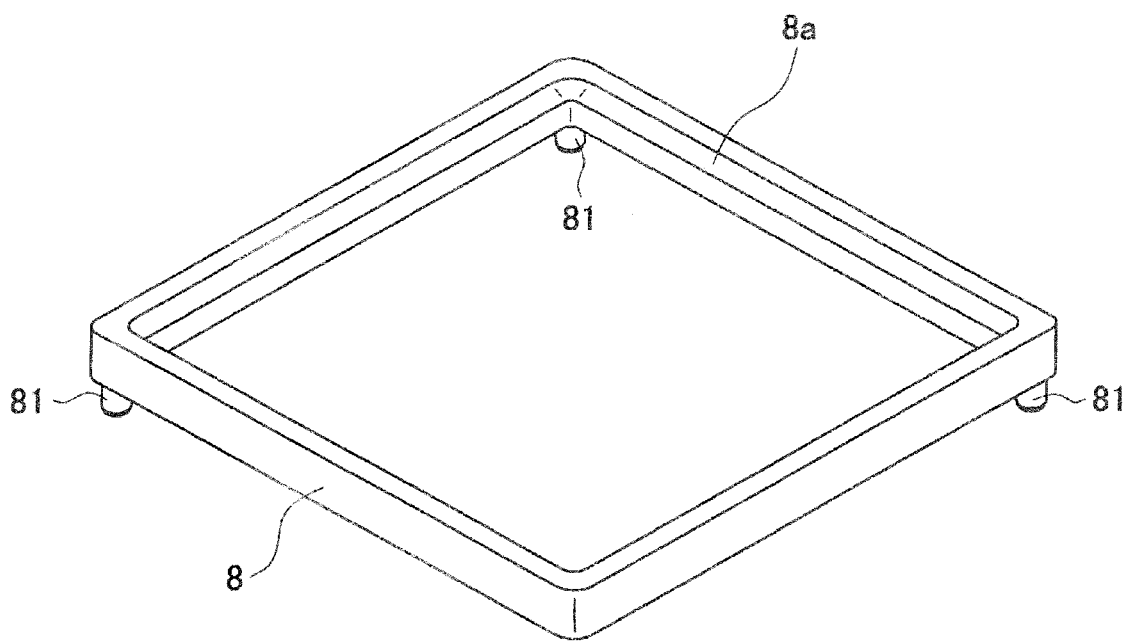
FIG. 8 is a perspective view of the insulating frame of the connector shown in FIG. 1.

As shown in FIG. 8, the insulating frame 8 is a rectangular frame. The insulating frame 8 has an upper surface formed with a tapered surface 8a which guides a lower part of the IC package 22. The insulating frame 8 has a bottom surface formed with positioning pins 81. The positioning pins 81 are used for positioning the insulating frame 8 with respect to the printed board 21. Further, the bottom surface of the insulating frame 8 is formed with a recess (not shown) for accommodating and holding the resin tapes 62. The methods of causing the insulating frame 8 to hold the holding portions, such as the resin tapes 62, include not only methods of bonding, adhesion by adhesive tape, and laser welding, but also a method of provision of nails (not shown) for holding the holding portions, such as the resin tapes 62, on the insulating frame 8.

Next, a description will be given of how to manufacture the contact member 3 with reference to FIGS. 9 to 12.

Figure 9:
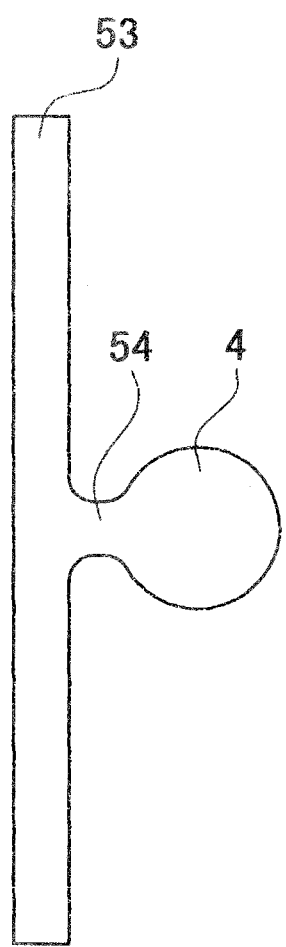
FIG. 9 is an enlarged side view of a linear core, a flat spring portion, and a connection portion of the contact member which is being made.

First, as shown in FIG. 9, the linear core 4, the flat spring portions 53, and the connection portions 54 are formed by extrusion molding. At this time, the flat spring portions 53 are in the form of one long plate which extends in the longitudinal direction of the linear core 4, and the connection portions 54 are in the form of one linear body which extends in the longitudinal direction of the linear core 4.

Figure 10:
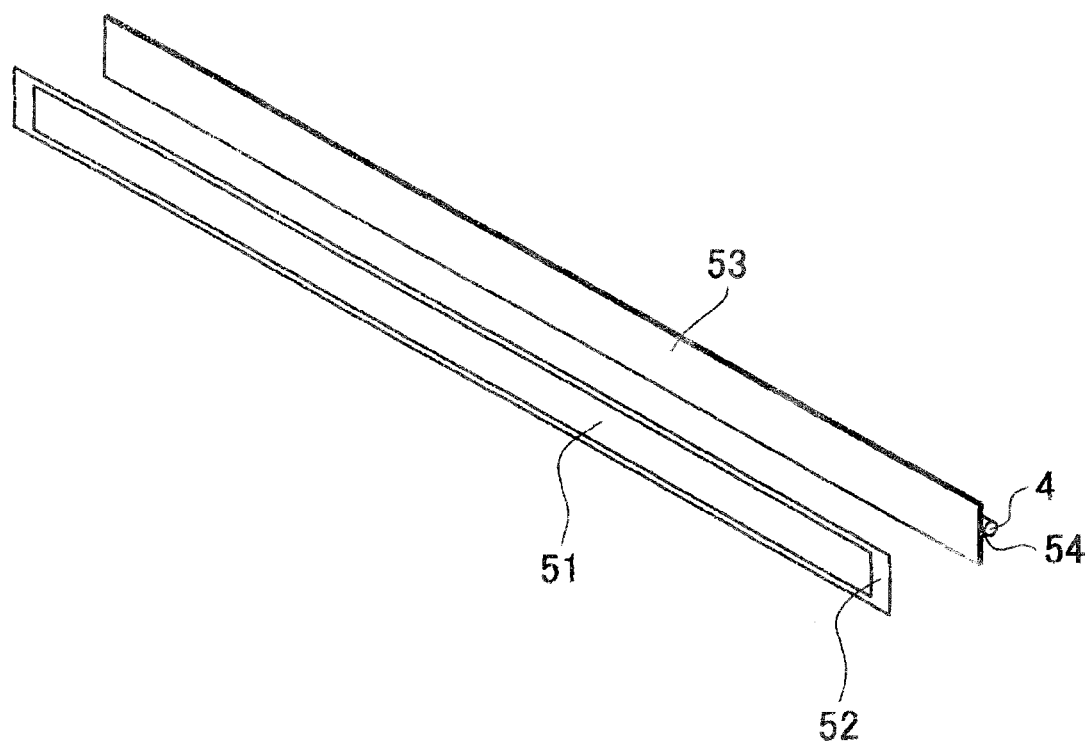
FIG. 10 is a perspective view of the flat spring portion shown in FIG. 9 in a state before bonding an insulating film thereto.

Next, the insulating film 52 having the conductive film 51 patterned thereon is bonded to the flat spring portion 53 (see FIG. 10). At this time, the conductive film 51 is in the form of one large thin film which covers the entire surface of the insulating film 52. As another example, the conductive film 51 may be formed directly on the flat spring portion 53 by plating or sputtering.

Figure 11:
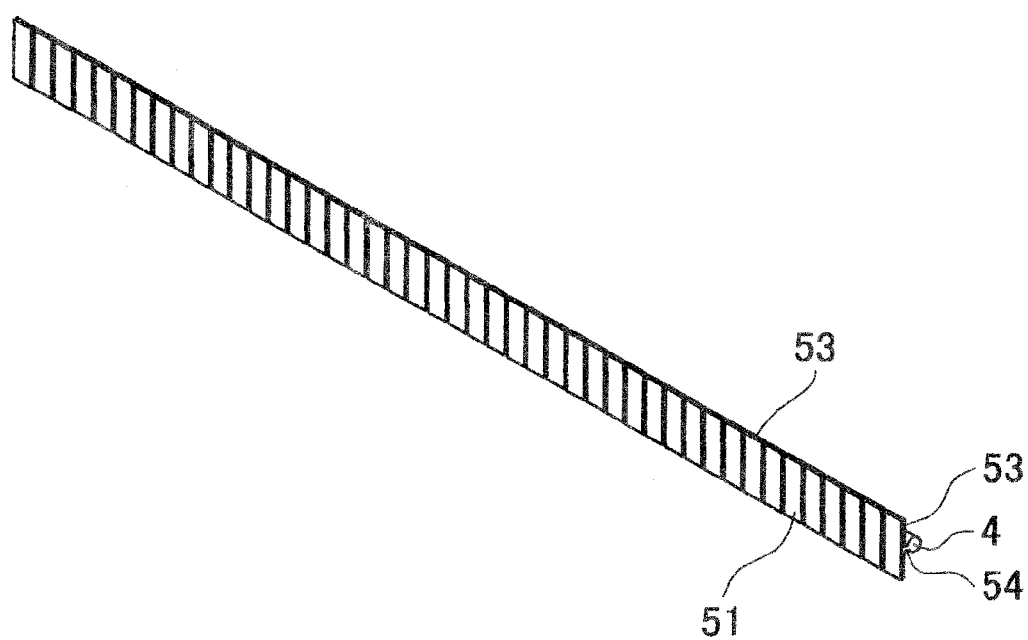
FIG. 11 is a perspective view of the flat spring portion in a state cut at equally-spaced intervals in a longitudinal direction thereof.
Figure 12:
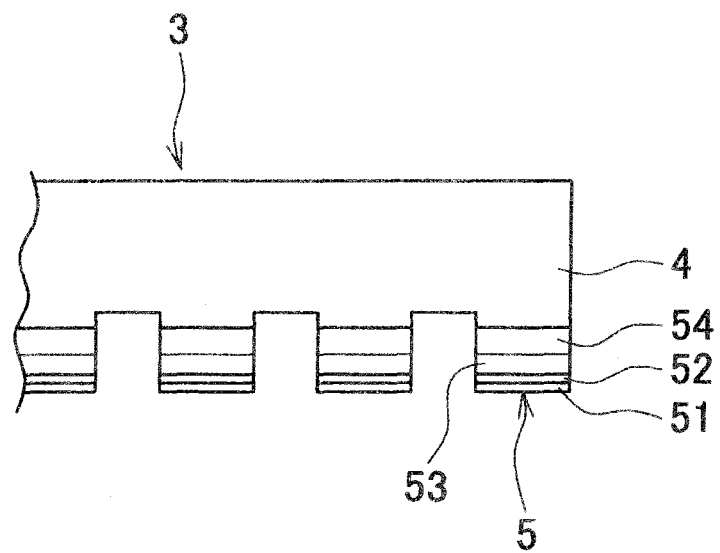
FIG. 12 is an enlarged plan view of one end of the flat spring portion shown in FIG. 11.

Then, the flat spring portion 53 (one long plate), the connection portion 54 (one linear body), the insulating film 52 (one film), and the conductive film 51 (one thin film) are each cut and divided into a plurality of separate portions, using a rotary blade (not shown) (see FIGS. 11 and 12).

Finally, the separate flat spring portions 53 are subjected to forming using a shaping die (not shown) such that the cross-section of each flat spring portion 53 is formed into a C shape. In performing the forming, it is preferable that the shaping die is heated.

When the above-described working process is through, the contact member 3 shown in FIGS. 6 and 7 is completed.

Next, a description will be given of how to form a net N by weaving the linear cores 4 and the wires 61 and 61' with reference to FIGS. 13A to 15.

The plurality of wires 61 and 61' are arranged at equally-spaced intervals, and respective one ends thereof are sandwiched between two of the resin tapes 62. Then, predetermined areas of the resin tapes 62 are irradiated with laser light (see FIG. 13A). As a result, the resin tapes 62 are melted and stuck to the wires 61 and 61', whereby the respective one ends of the wires 61 and 61' are held by the resin tapes 62.

Figure 13A:
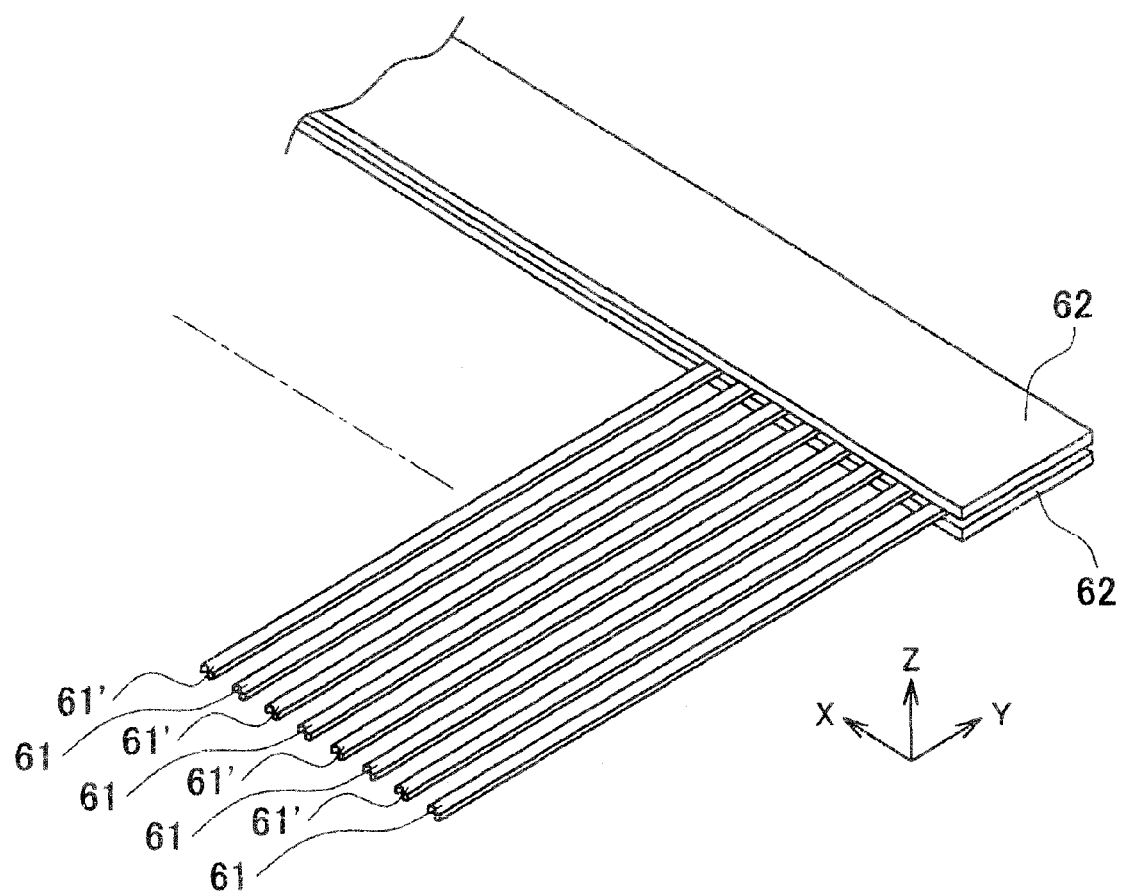
FIG. 13A is a perspective view of one ends of a plurality of wires in a state held by resin tapes.
Figure 13B:
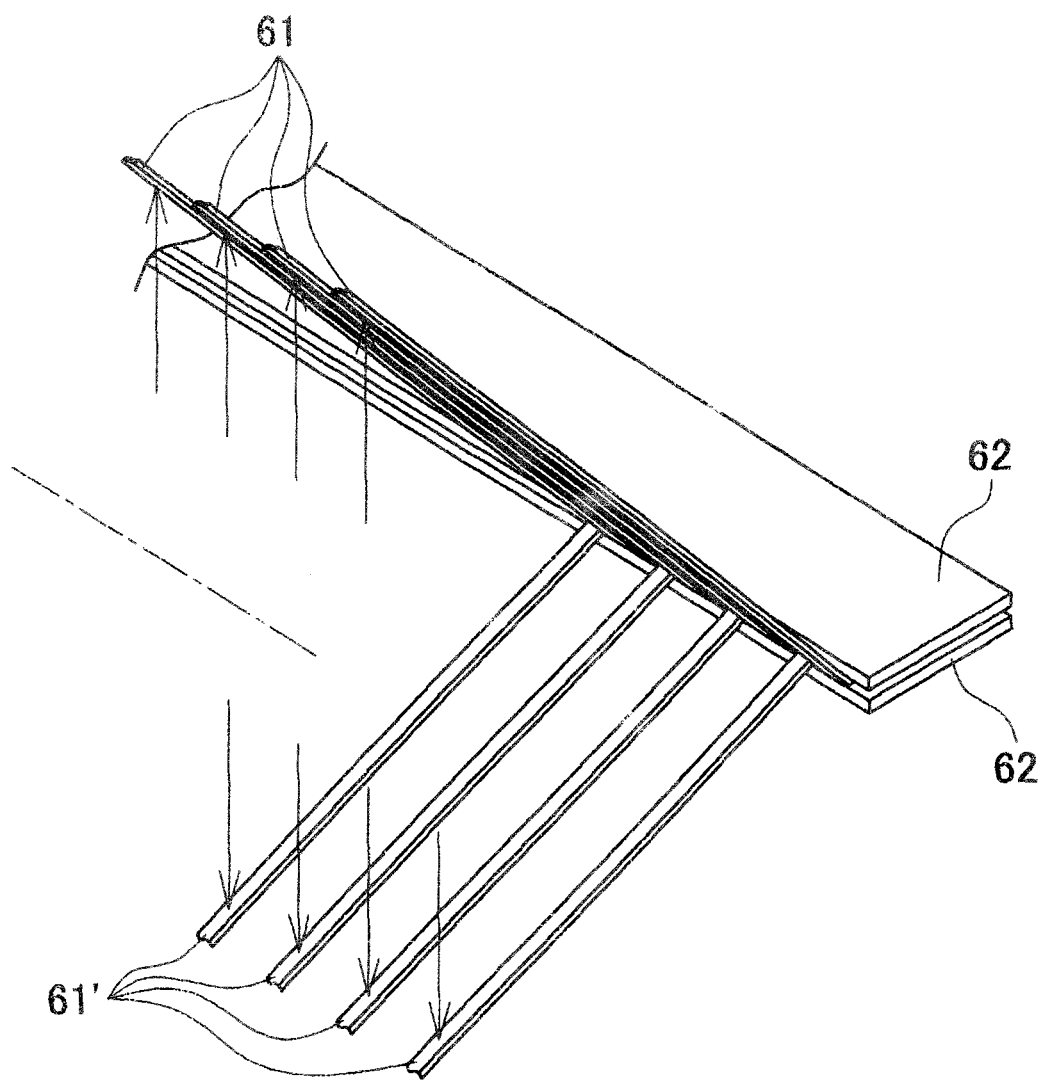
FIG. 13B is a perspective view of the plurality of wires in a state separated into two groups.

Next, the wires 61, which are arranged at respective odd-numbered positions from one end of each resin tape 62, are moved upward, and the wires 61', which are arranged at respective even-numbered positions from the one end of each resin tape 62, are moved downward (see FIG. 13B).

Figure 14A:
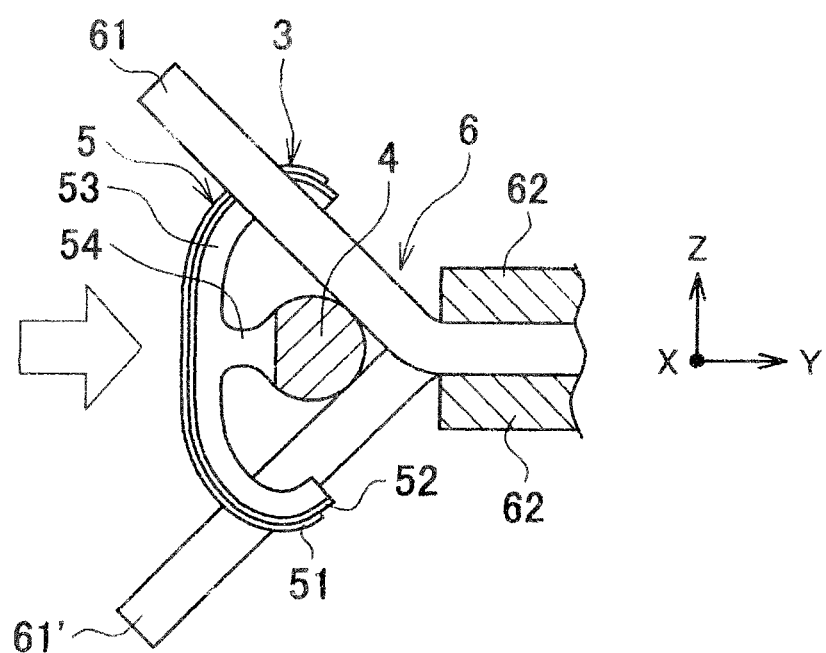
FIG. 14A is a cross-sectional view of a wire of one group and a wire of the other group in a state in which a first contact member is disposed therebetween.

Then, as shown in FIG. 14A, a first one of the contact members 3 is placed between the wires 61 at the odd-numbered positions and the wires 61' at the even-numbered positions.

Figure 14B:
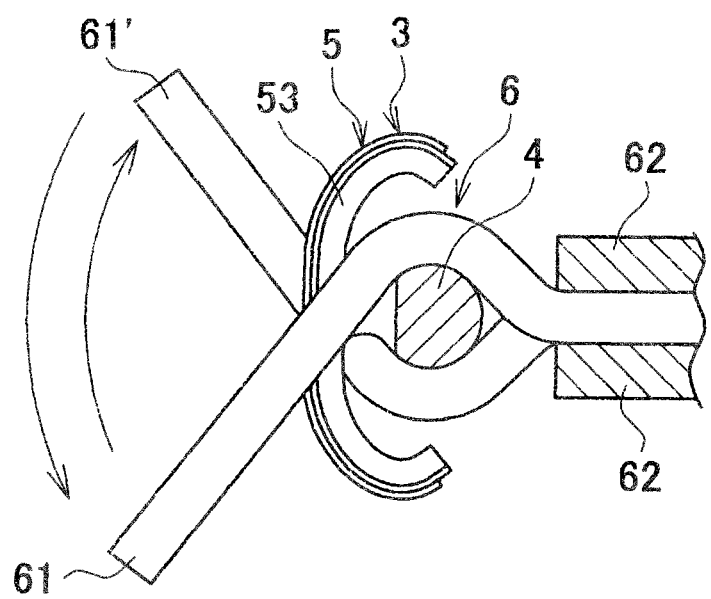
FIG. 14B is a cross-sectional view of the wires in a state wound around the linear core.

Next, as shown in FIG. 14B, the wires 61 at the odd-numbered positions are moved downward, and the wires 61' at the even-numbered positions are moved upward to thereby place the wires 61 and 61' around the linear core 4 of the first one of the contact member 3.

Figure 14C:
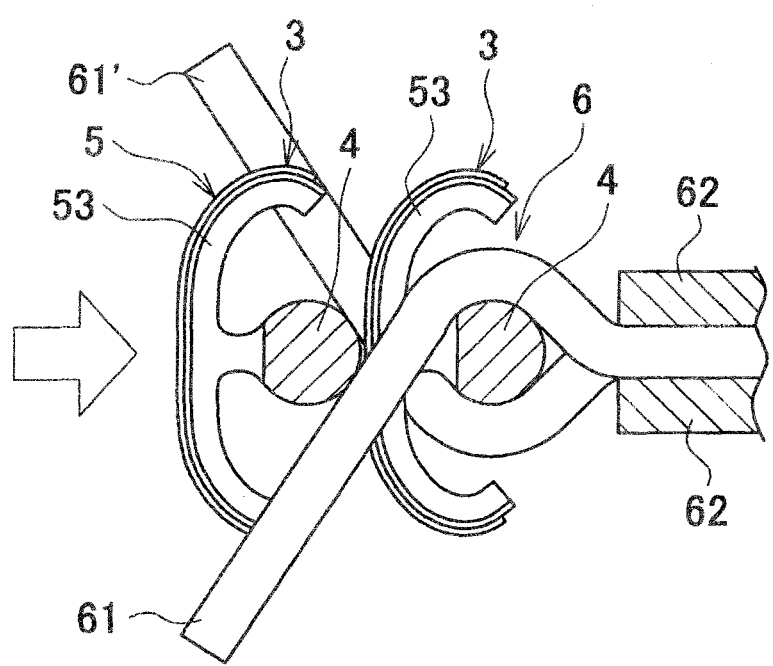
FIG. 14C is a cross-sectional view of the wire of the one group and the wire of the other group in a state in which a second contact member is disposed therebetween.

Then, as shown in FIG. 14C, a second one of the contact members 3 is placed between the wires 61 at the odd-numbered positions and the wires 61' at the even-numbered positions.

Next, the wires 61 at the odd-numbered positions are moved upward, and the wires 61' at the even-numbered positions are moved downward to thereby place the wires 61 and 61' around the linear core 4 of the second one of the contact member 3.

Figure 15:
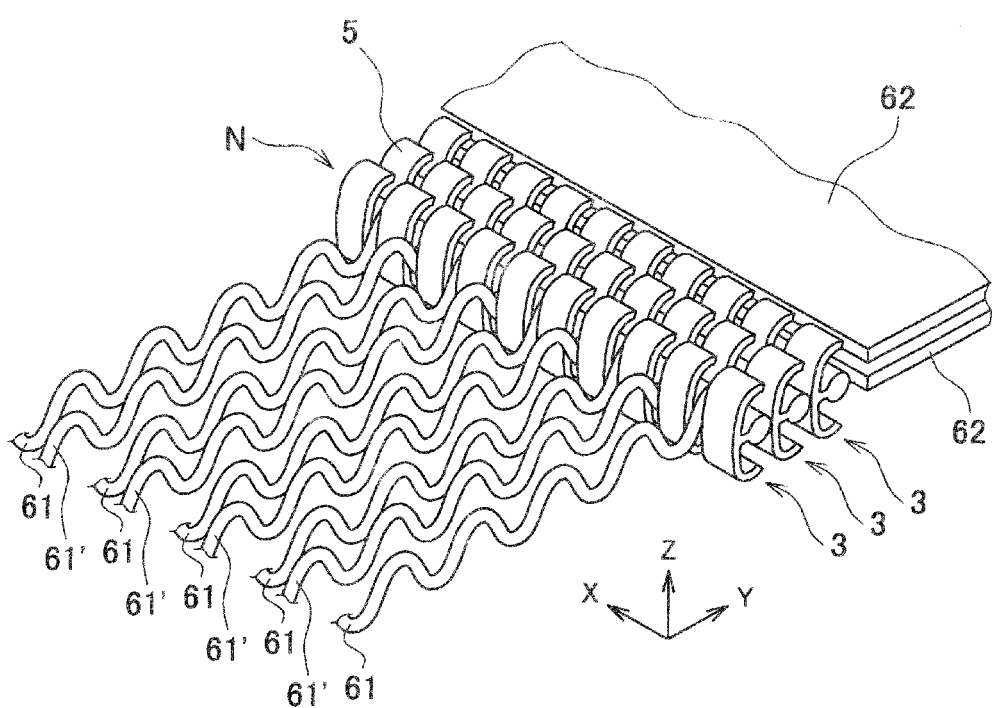
FIG. 15 is a perspective view of the linear cores and the wires in a weaved state.
Figure 16:
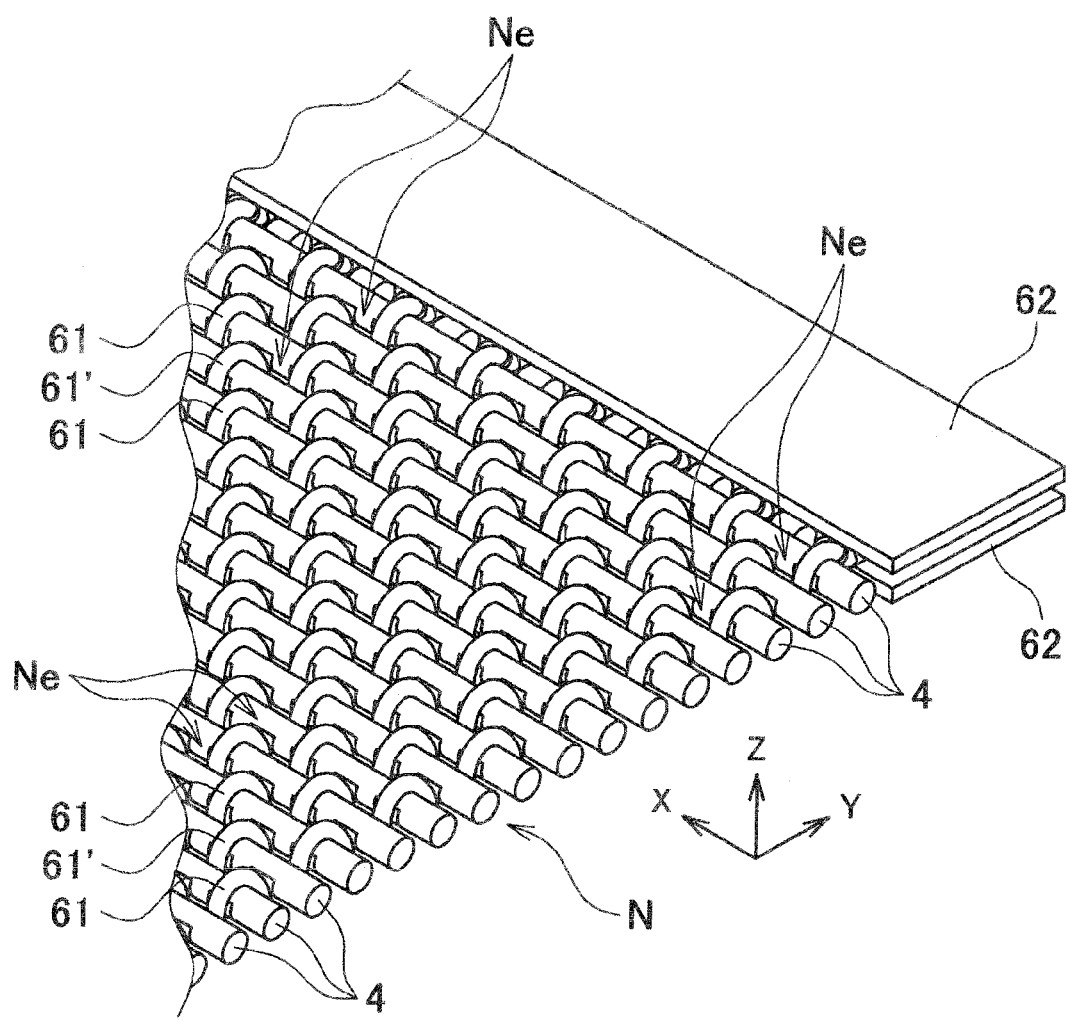
FIG. 16 is a perspective view of a net formed by weaving the linear cores and the wires (but with omission of conductive path portions of the contact members, etc.)

By repeating the above-described operation thereafter, as shown in FIG. 15, the linear cores 4 of the contact members 3 and the wires 61 and 61' are weaved whereby the net N is formed (see FIG. 16). In FIG. 15, due to presence of the conductive path portions 5, it is difficult to comprehend a state of formation of the net N. To eliminate this inconvenience, in FIG. 16, the net N formed by arranging the wires 61 and 61' alternatingly differently around (i.e. alternatingly oppositely from above and from below) each linear core is illustrated in a state having the conductive path portions 5 omitted therefrom. When the linear cores 4 of the contact members 3 and the wires 61 and 61' are weaved, the wires 61 and 61' are passed between the conductive path portions 5, whereby the conductive path portions 5 are disposed in a manner extending through a mesh Ne of the net N.

After the weaving of the linear cores 4 of the contact members 3 and the wires 61 and 61', described above, is completed, the other ends of the wires 61 and 61' are cut off. Then, similarly to the one ends of the wires 61 and 61', the other ends of the wires 61 and 61' are sandwiched between two of the resin tapes 62, and the resin tapes 62 are melted and stuck to the other ends of the wires 61 and 61' by irradiation of laser light.

When the above-described operation process is through, the net N shown in FIG. 16 is formed, and an assembly of the contact members 3 (see FIG. 3) held by the insulating holder 6 has been formed.

Figure 2:
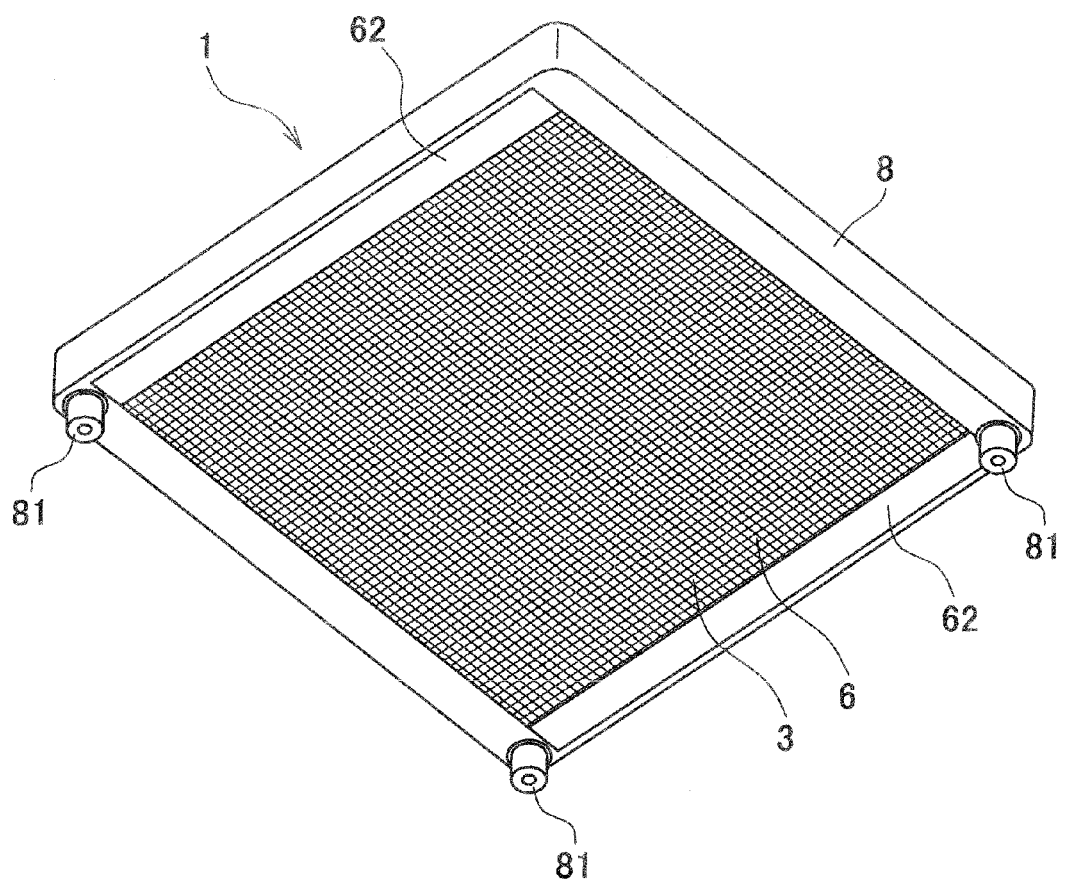
FIG. 2 is a perspective view of the connector shown in FIG. 1, as viewed obliquely from below.
Figure 3:
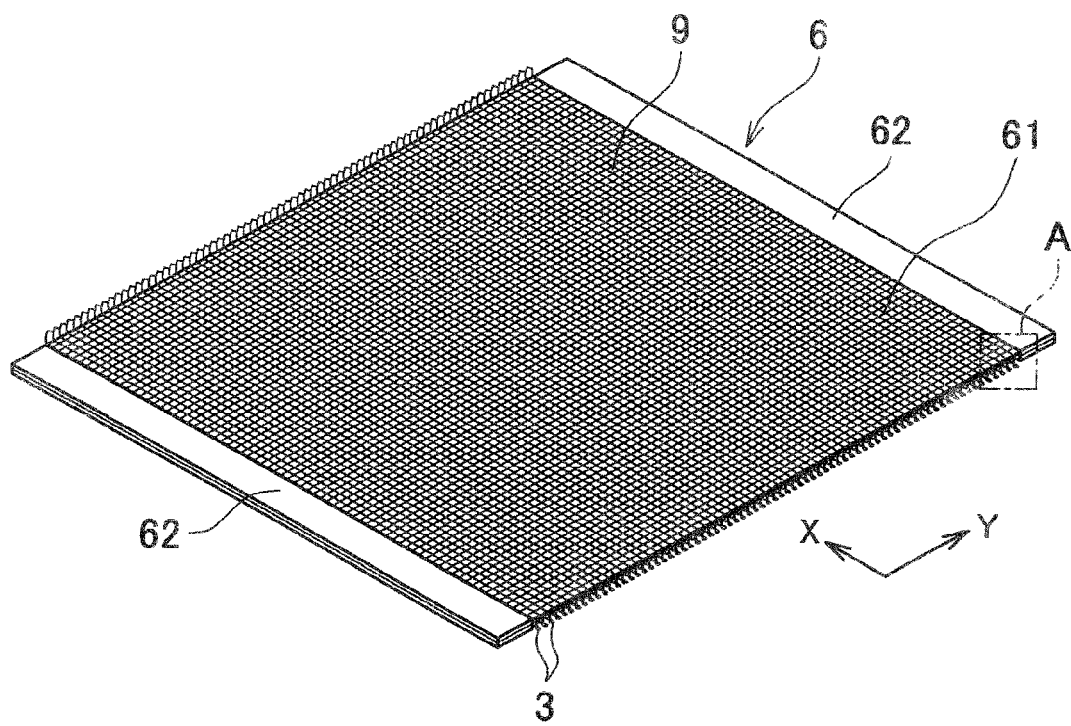
FIG. 3 is a perspective view of the connector shown in FIG. 1, in a state having an insulating frame removed therefrom.
Figure 4:
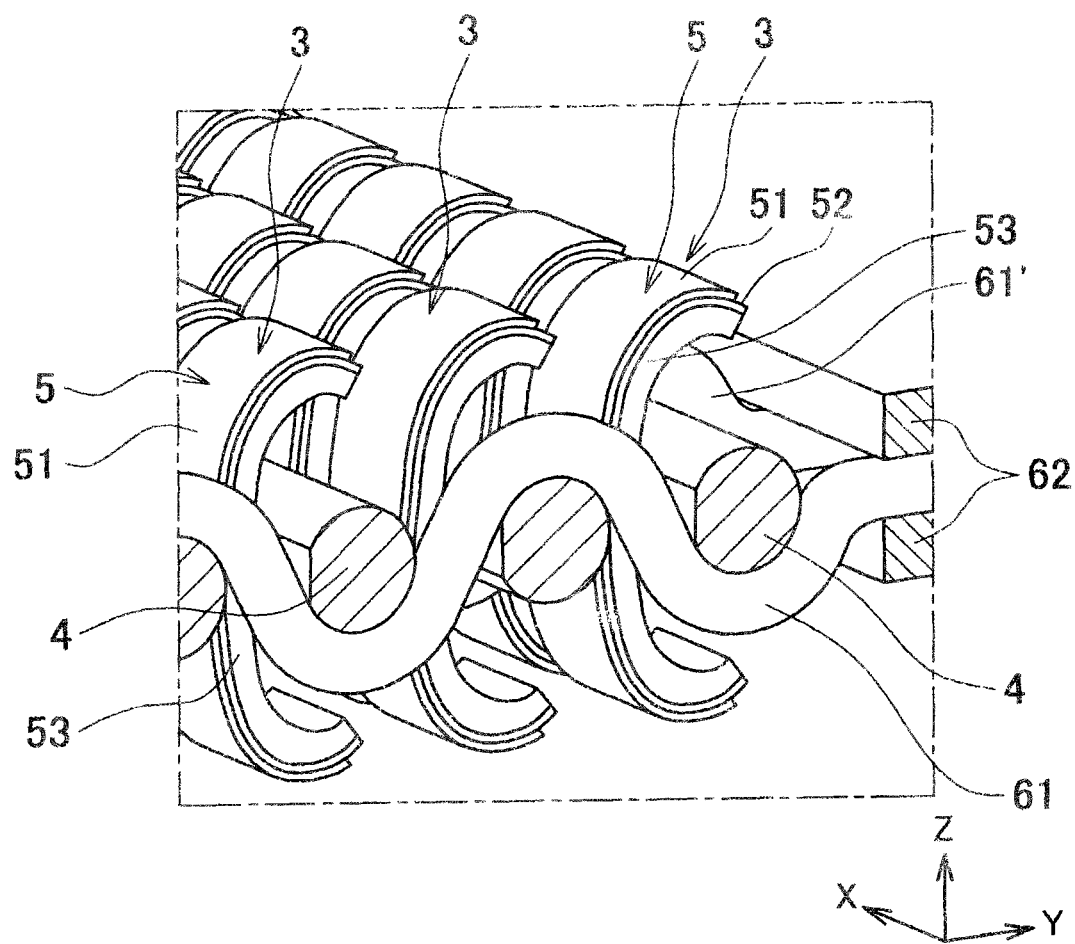
FIG. 4 is an enlarged cross-sectional view of a portion A in FIG. 3.

Finally, the resin tapes 62 of the insulating holder 6 are bonded to the recess formed in the bottom surface of the insulating frame 8 (see FIG. 2). At this time, the resin tapes 62 are bonded to the recess of the insulating frame 8 in a manner applying tension to the wires 61 and 61'. By the above-described operations, the connector 1 shown in FIG. 1 is completed.

Next, a description will be given of how to use the connector 1 with reference to FIGS. 17 to 20.

Figure 17:
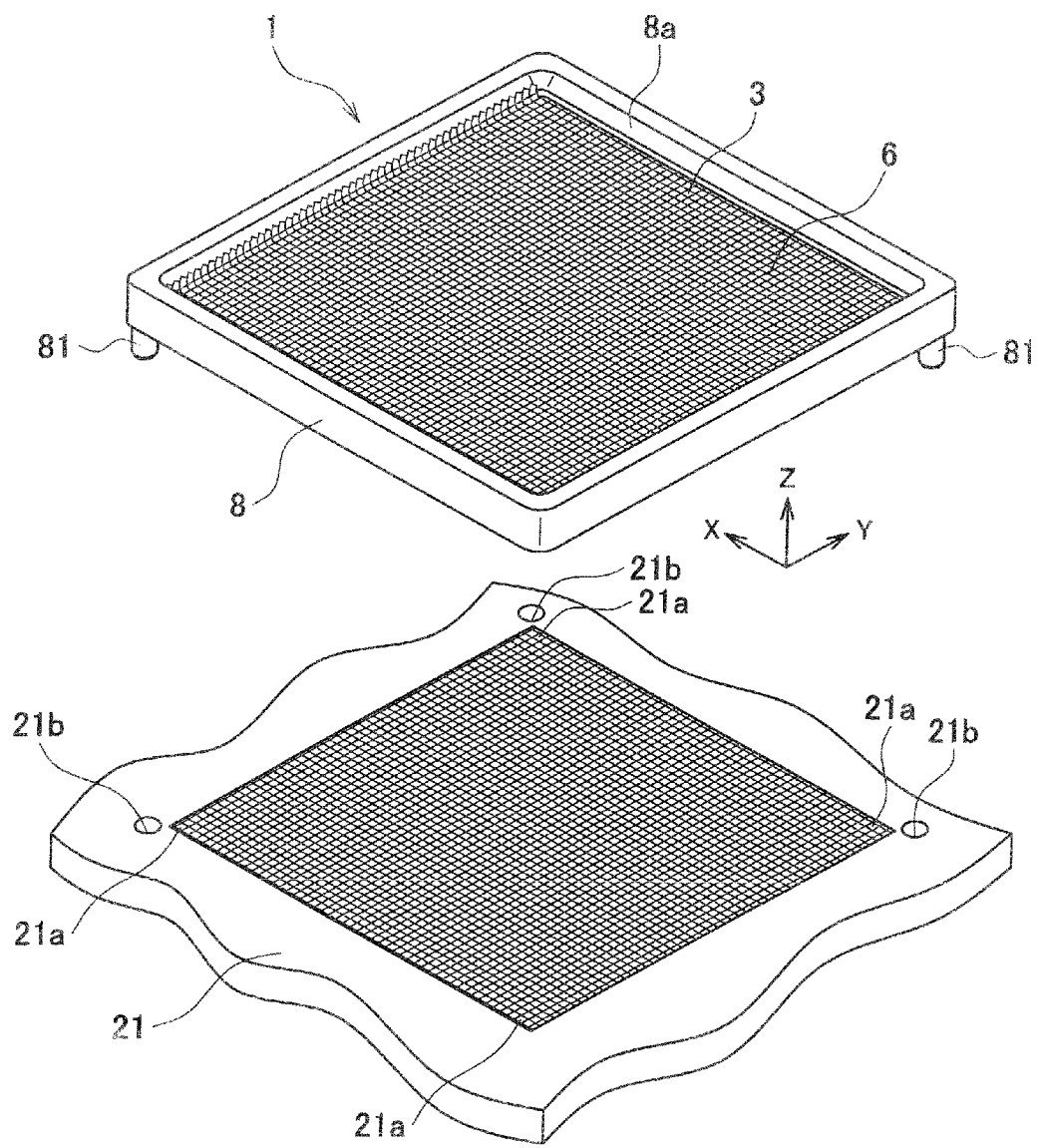
FIG. 17 is a perspective view of the connector shown in FIG. 1 in a state before the connector is disposed on a printed board.
Figure 20:
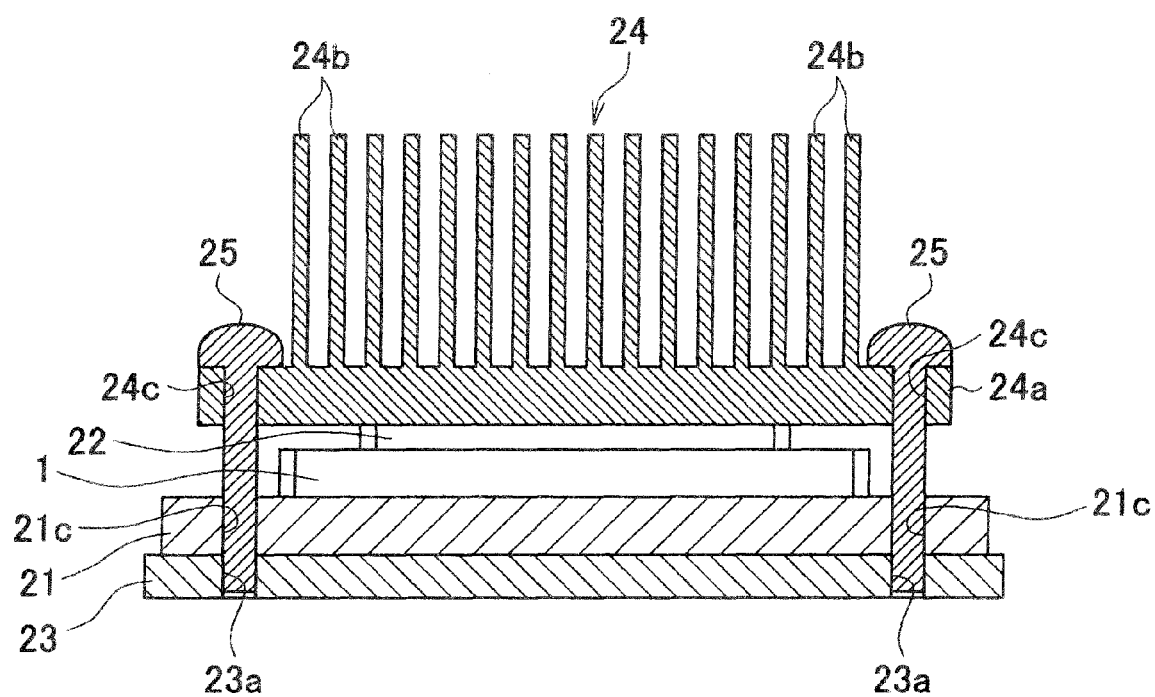
FIG. 20 is a cross-sectional view of a metallic plate, the printed board, the connector, the IC package, and a heat sink, in a state connected with bolts.

First, as shown in FIG. 17, the connector 1 is disposed on the printed board 21 disposed on a metallic plate 23 (see FIG. 20). At this time, the positioning pins 81 are inserted in positioning holes 21b of the printed board 21. As a result, the connector 1 is positioned on the printed board 21, and a lower end of the conductive path portion 5 of each contact member 3 of the connector 1 is brought into contact with an associated one of terminal portions (second terminal portions) 21a of the printed board 21.

Figure 18:
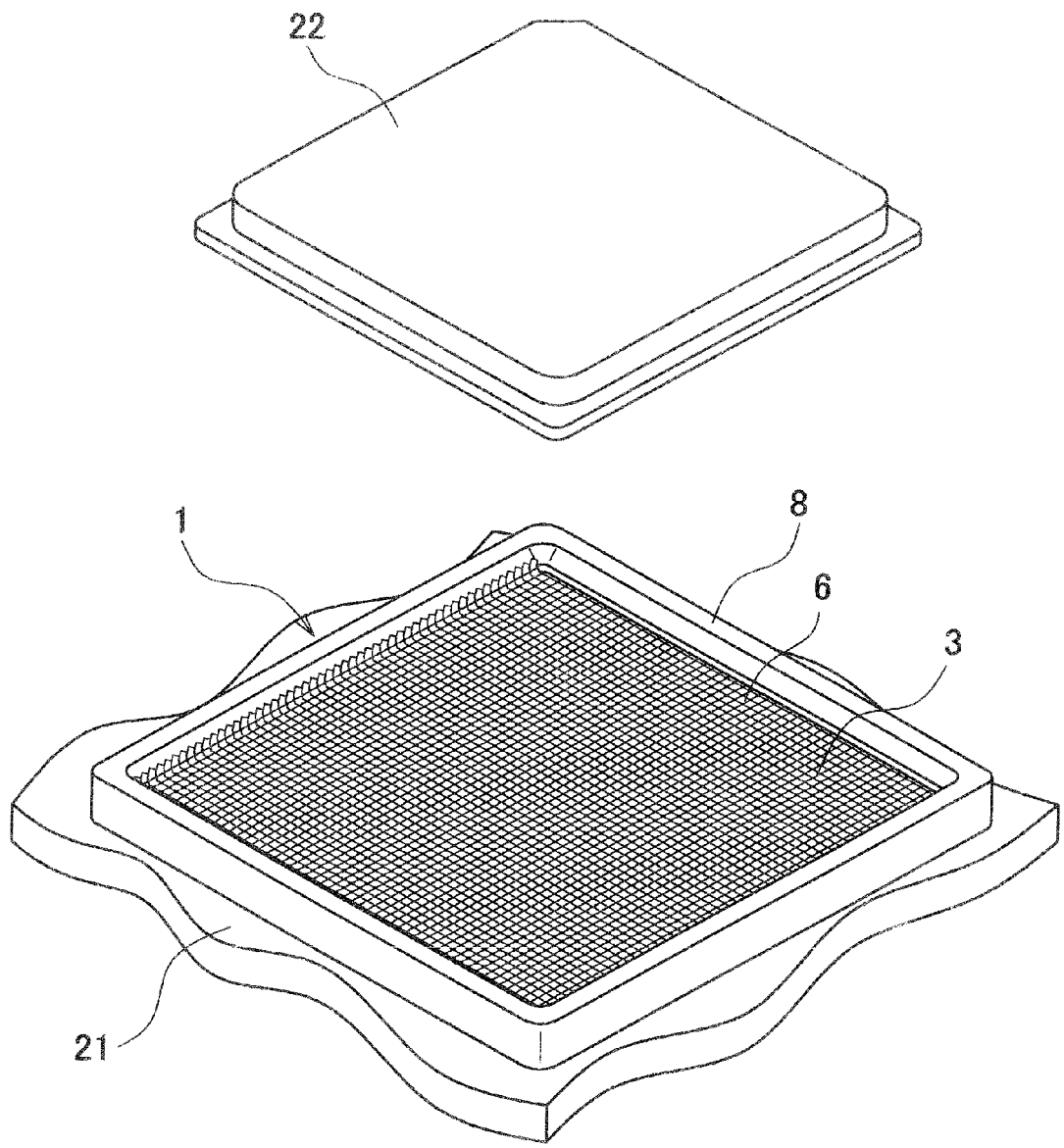
FIG. 18 is a perspective view of the connector disposed on the printed board in a state before having an IC package disposed thereon.
Figure 19:
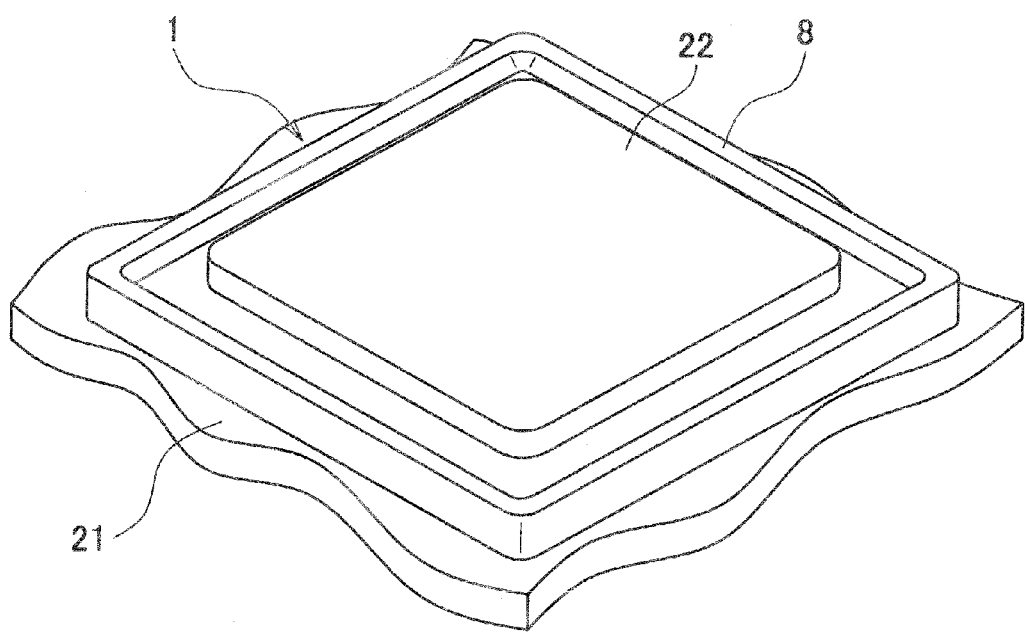
FIG. 19 is a perspective view of the connector disposed on the printed board in a state having the IC package disposed thereon.

Next, as shown in FIGS. 18 and 19, the IC package 22 is inserted in the insulating frame 8 of the connector 1. As a result, an upper end of the conductive path portion 5 of each contact member 3 of the connector 1 is brought into contact with an associated one of terminal portions (first terminal portions), not shown, of the IC package 22.

Thereafter, as shown in FIG. 20, a heat sink 24 is disposed on the IC package 22, and bolts 25 are inserted through holes 24c formed through a plate portion 24a of the heat sink 24 and holes 21c formed through the printed board 21, respectively. Then, the front ends of the bolts 25 are screwed into screw holes 23a formed in the metallic plate 23, respectively. As a result, the metallic plate 23, the printed board 21, the connector 1, the IC package 22, and the heat sink 24 are connected in a direction Z of the height to form one piece, and the flat spring portions 53 of the contact members 3 of the connector 1 are sandwiched and compressed between the printed board 21 and the IC package 22, whereby the terminal portions 21a of the printed board 21 and the terminal portions of the IC package 22 are electrically connected by the conductive films 51.

Heat generated in the IC package 22 is released through fins 24b of the heat sink 24. In a case where the connector 1 according to the present embodiment is used as a socket of an inspection device, not shown, electrical connection may be achieved by applying pressure from above, instead of using the bolts 25.

According to the present embodiment, the net N is formed by weaving the linear cores 4, and the wires 61 and 61', and the conductive path portions 5 are arranged in the mesh Ne, which makes the net N easily deformable in the direction Z of the height. As a result, when the conductive path portions 5 of the contact members 3 are sandwiched between the printed board 21 and the IC package 22, even if, for example, a central portion of the printed board 21 or the IC package 22 warps, the net N follows the warpage, and hence the contact stability is maintained.

Further, the wires 61 and 61' are more flexible than the linear core 4, and hence when the linear cores 4 and the wires 61 and 61' are weaved, the contact members 3 do not wave, which improves the position accuracy of the conductive path portions 5 in the direction Z of the height.

Figure 21:
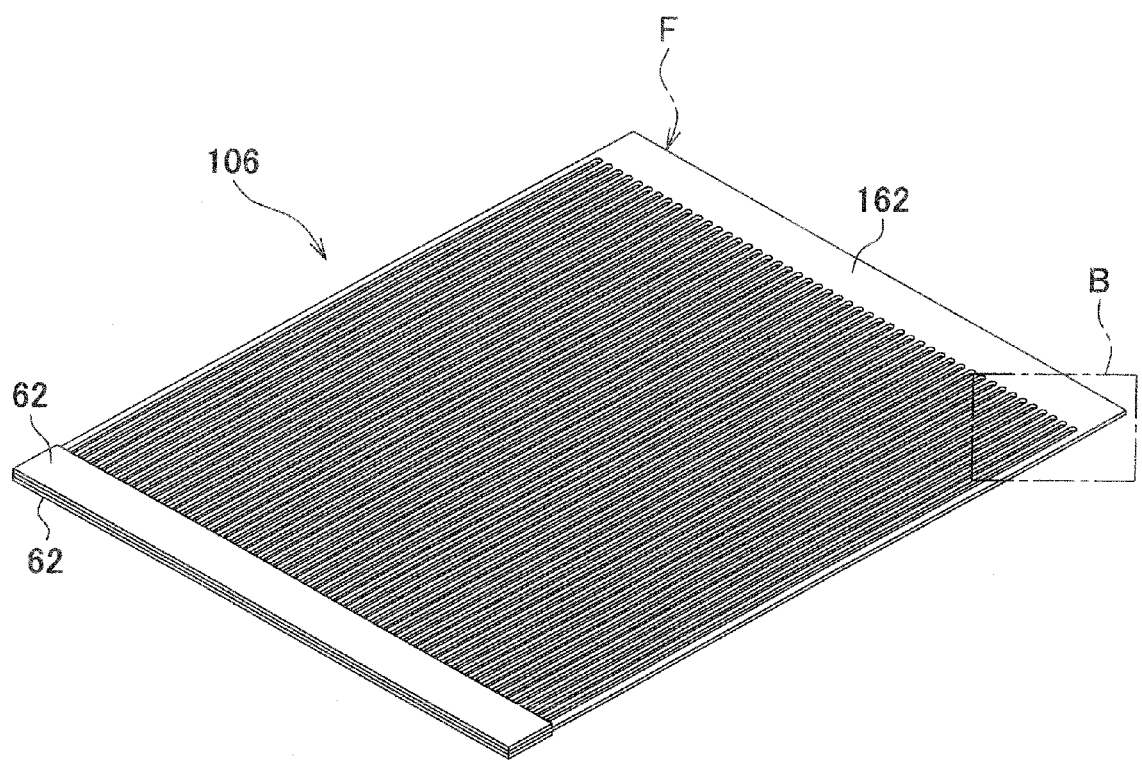
FIG. 21 is a perspective view of a variation of the first embodiment.
Figure 22:
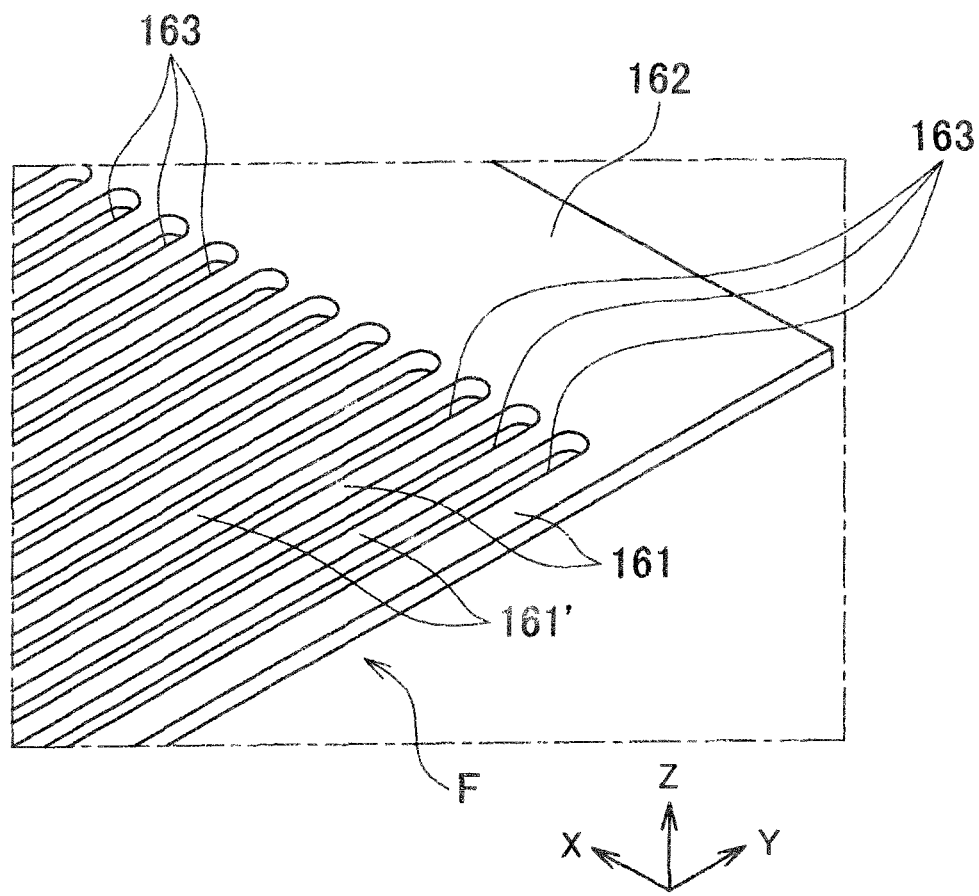
FIG. 22 is an enlarged view of a portion B in FIG. 21.

Next, a description will be given of a variation of the first embodiment with reference to FIGS. 21 and 22.

Hereafter, only a main difference from the first embodiment (the arrangement of an insulating holder) will be described. Except the arrangement of the insulating holder, the variation is the same as the first embodiment. Description of the same arrangements as described in the first embodiment is omitted.

In this variation, a plurality of slits 163 arranged parallel to each other at equally-spaced intervals are formed in a flexible film F whereby a plurality of wires (linear insulating portions) 161 and 161' are formed. The flexible film F is a resin film formed of a material mainly composed of e.g. polyimide. The methods of processing the wires 161 and 161' include, for example, a method of press processing and a method of laser processing.

In the insulating holder, denoted by reference numeral 106, according to the variation, one ends of the plurality of wires 161 and 161', and one holding portion 162 are integrally formed. The other ends of the plurality of wires 161 and 161' are held by the resin tapes 62, similarly to the first embodiment.

According to the variation, it is possible to obtain the same advantageous effects as provided by the first embodiment.

Next, a description will be given of a second embodiment of the present invention with reference to FIGS. 23 and 24.

Components identical to those in the above-described first embodiment are denoted by the same reference numerals, and description thereof is omitted. Hereafter, only main differences from the first embodiment will be described.

Although the connector 1 according to the first embodiment is a connector which connects between the printed board 21 and the IC package 22, a connector 201 according to the second embodiment is a connector which connects between the printed boards 21.

Figure 23:
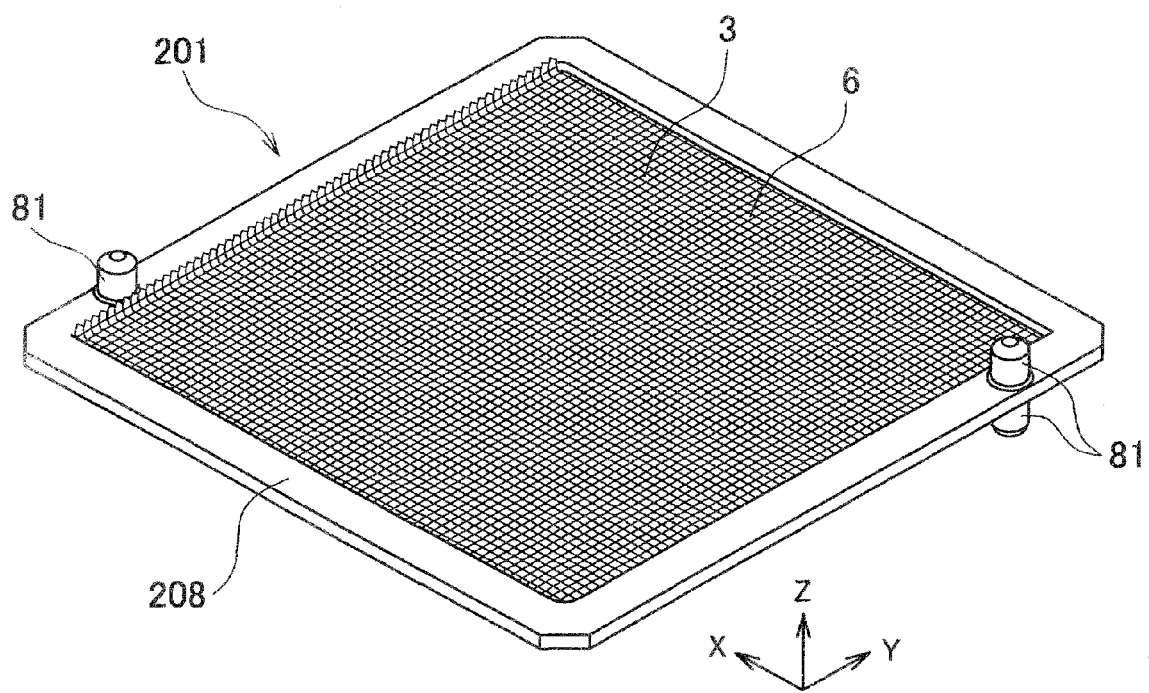
FIG. 23 is a perspective view of a connector according to a second embodiment of the present invention.
Figure 24:
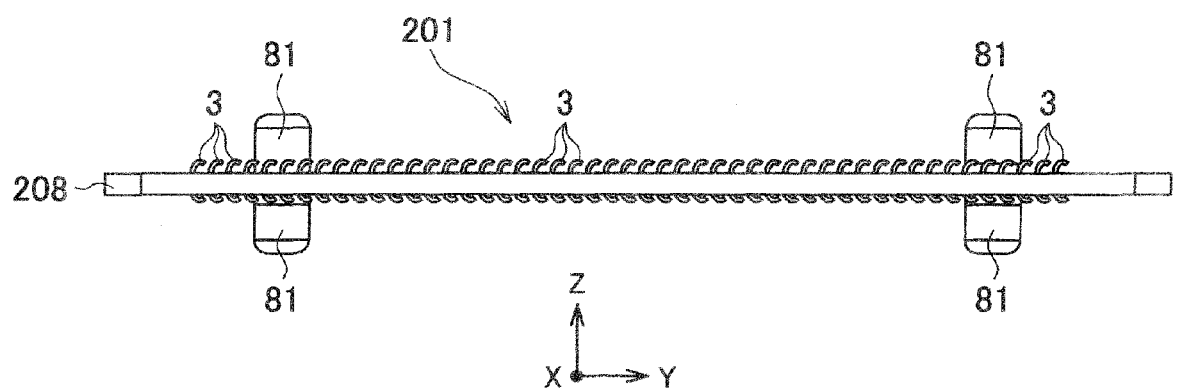
FIG. 24 is a side view of the connector shown in FIG. 23.
Figure 25:
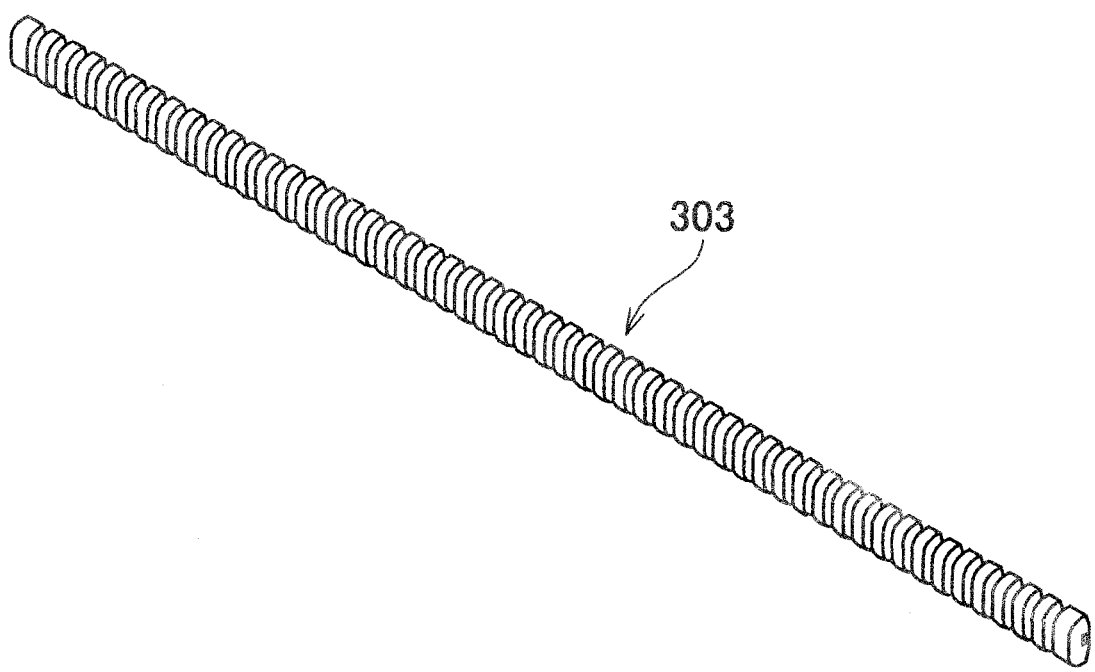
FIG. 25 is a perspective view of a contact member of a connector according to a third embodiment of the present invention.
Figure 26:
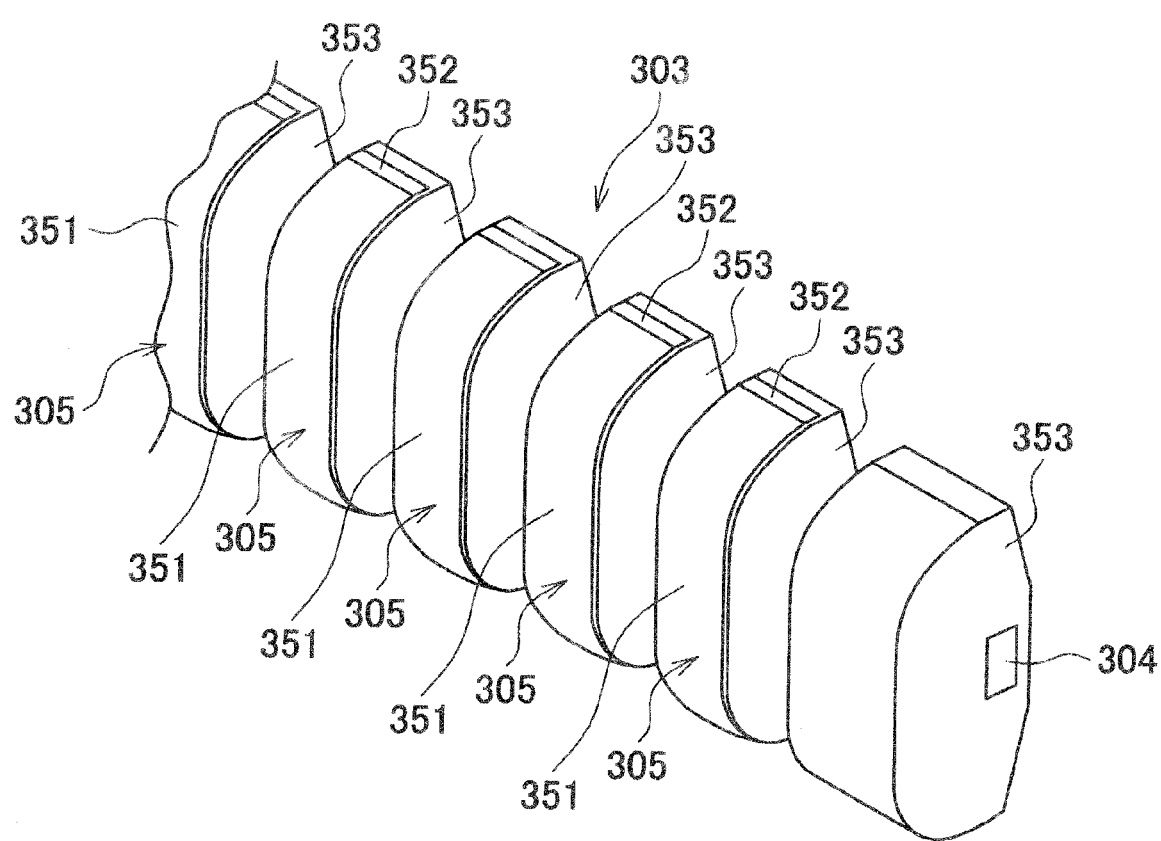
FIG. 26 is an enlarged perspective view of one end of the contact member shown in FIG. 25.
Figure 27:
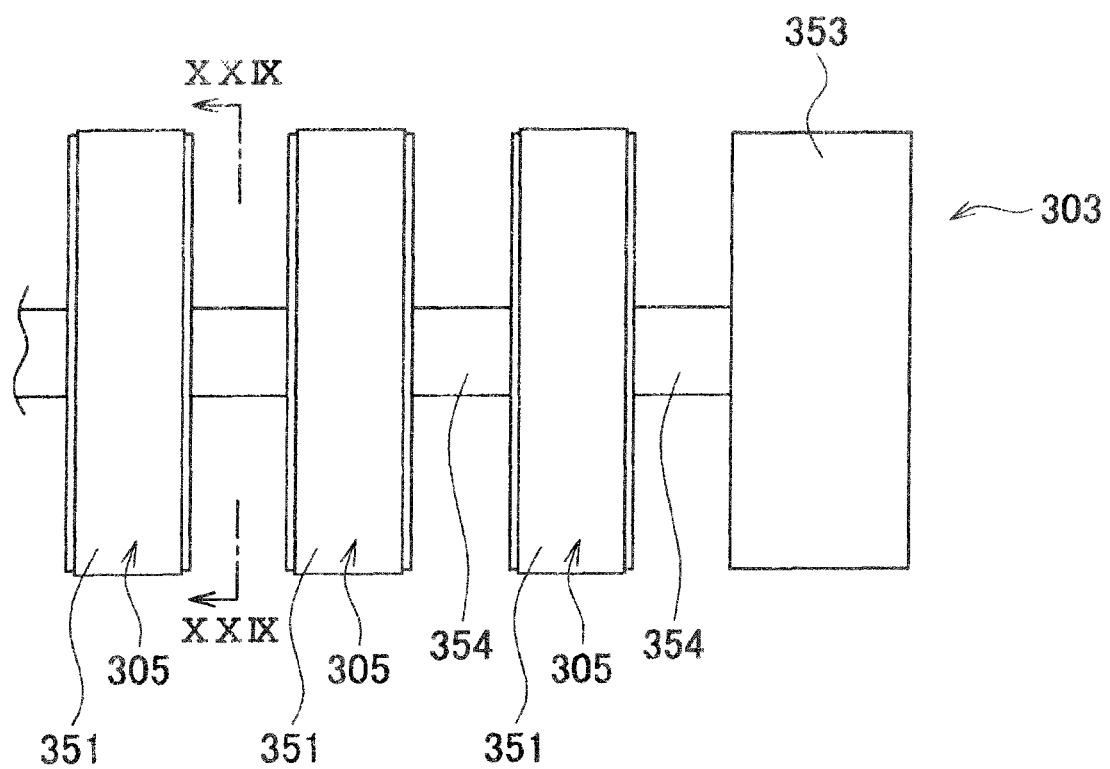
FIG. 27 is an enlarged front view of the contact member shown in FIG. 26.
Figure 28:
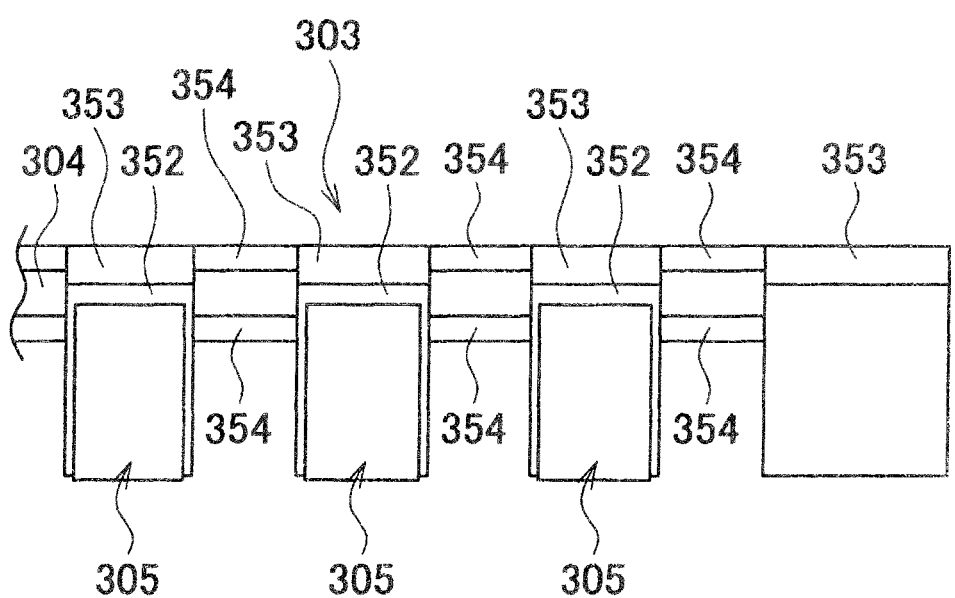
FIG. 28 is an enlarged plan view of the contact member shown in FIG. 26.

As shown in FIGS. 23 and 24, an insulating frame 208 is smaller in dimension in the direction Z of the height than each contact member 3 held by the insulating holder 6. Further, the insulating frame 208 has an upper surface and a lower surface each provided with the positioning pins 81 for positioning the printed boards 21.

According to the second embodiment, it is possible to obtain the same advantageous effects as provided by the first embodiment.

Next, a description will be given of a third embodiment of the present invention with reference to FIGS. 25 to 29.

Hereafter, only a main difference from the above-described first embodiment (the arrangement of a contact member 303) will be described. Except the arrangement of the contact member, the third embodiment is the same as the first embodiment. Description of components identical to those of the first embodiment is omitted.

As shown in FIGS. 25 to 29, the contact member 303 is formed by a linear core 304 and a plurality of conductive path portions 305.

Each conductive path portion 305 includes a conductive film 351, an insulating film 352, and an insulating elastic member 353. Similarly to the first embodiment, the insulating film 352 is affixed to the insulating elastic member 353, and the conductive film 351 is formed on the surface of the insulating film 352.

The insulating elastic member 353 has a substantially D-shaped cross-section. The insulating elastic members 353 are connected to the linear core 304 at equally-spaced intervals in a longitudinal direction of the linear core 304.

Ones of the insulating elastic members 353 located at opposite ends of the linear core 304 are larger in width (dimension in the direction of arrangement of the insulating elastic members 353) than the others of the insulating elastic members 353.

Figure 29A:
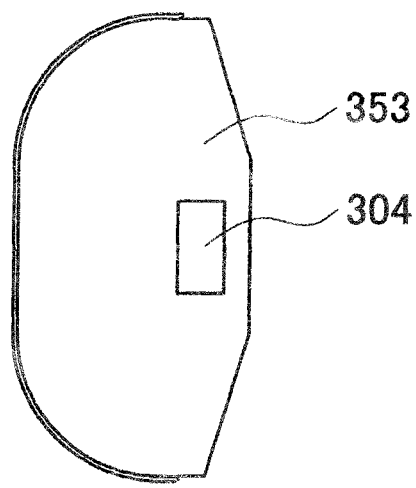
FIG. 29A is a side view of the contact member shown in FIG. 26.
Figure 29B:
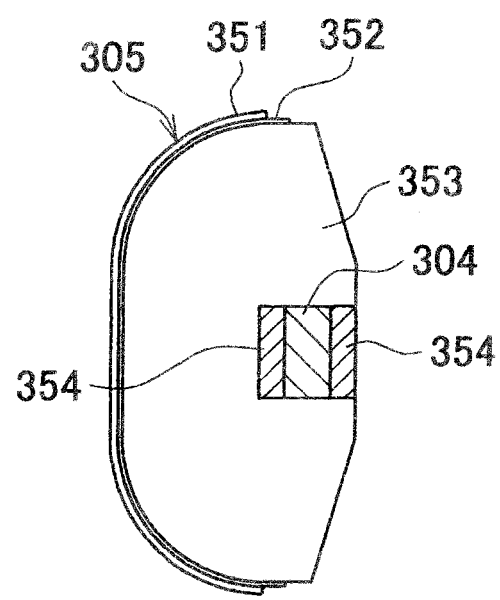
FIG. 29B is a cross-sectional view taken along XXIX-XXIX in FIG. 27.
Figure 30:
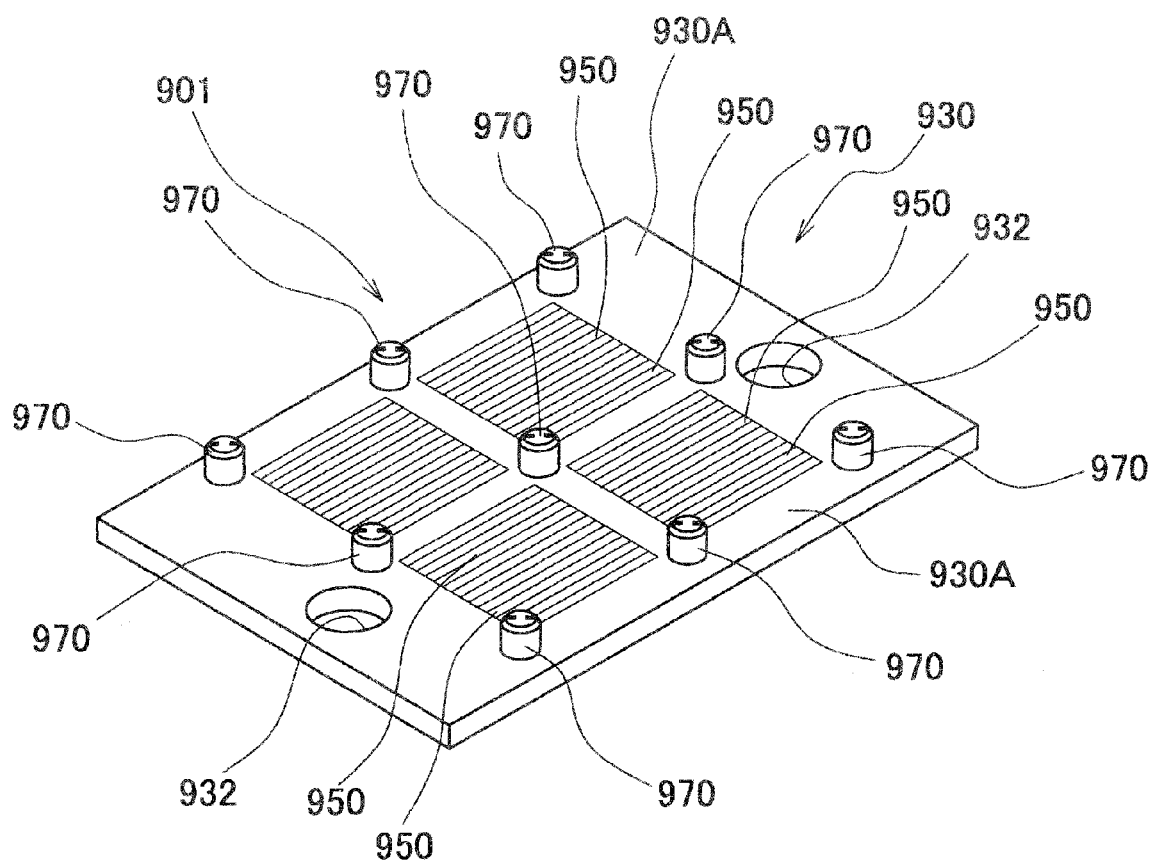
FIG. 30 is a perspective view of a conventional connector.
Figure 31:
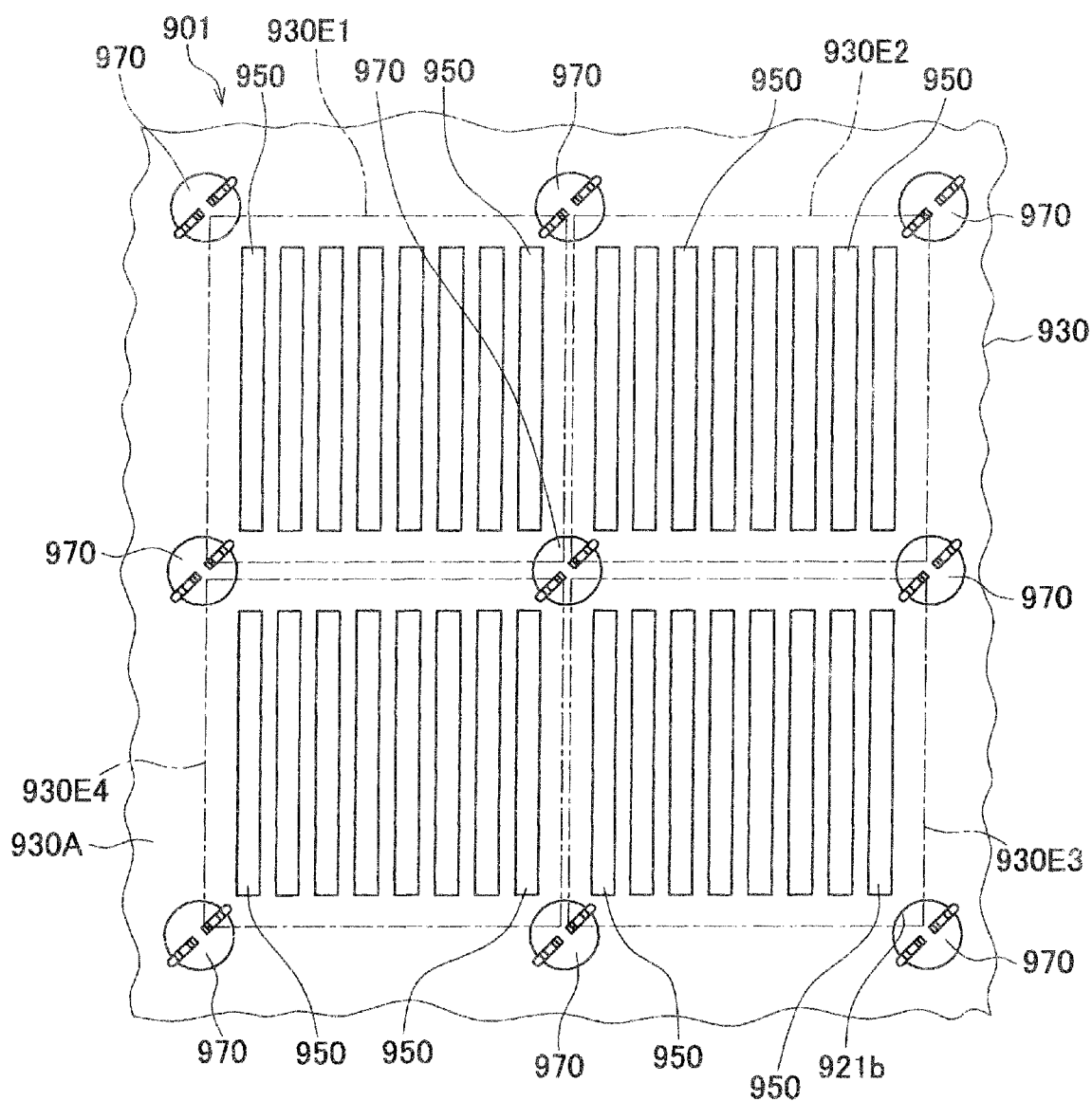
FIG. 31 is an enlarged view of part of a first board-disposing surface of an insulating plate of the connector shown in FIG. 30.
Figure 32:
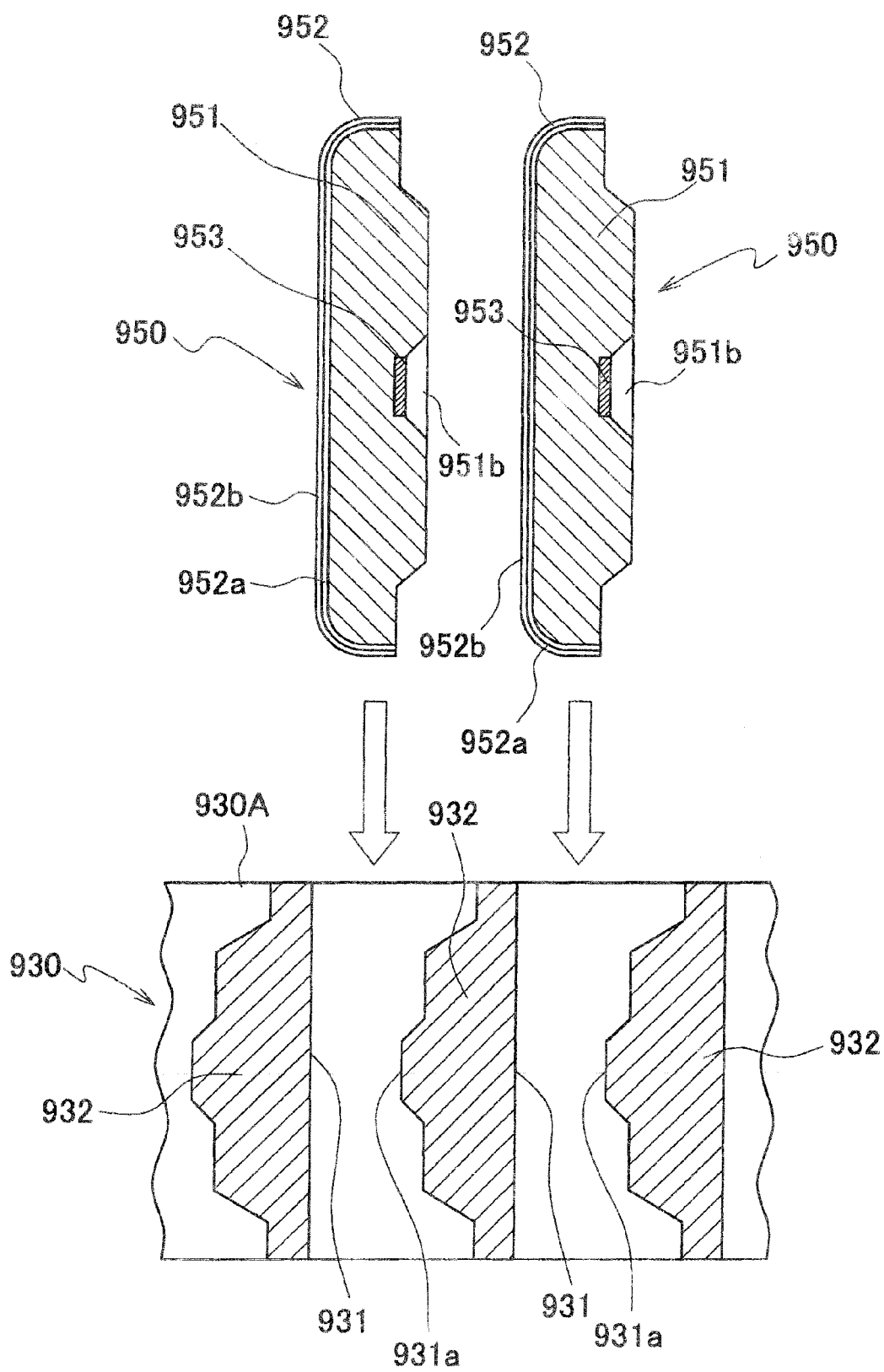
FIG. 32 is a cross-sectional view of elastic conductors in a state before being inserted in slits of the insulating plate of the connector shown in FIG. 30.
Figure 33:
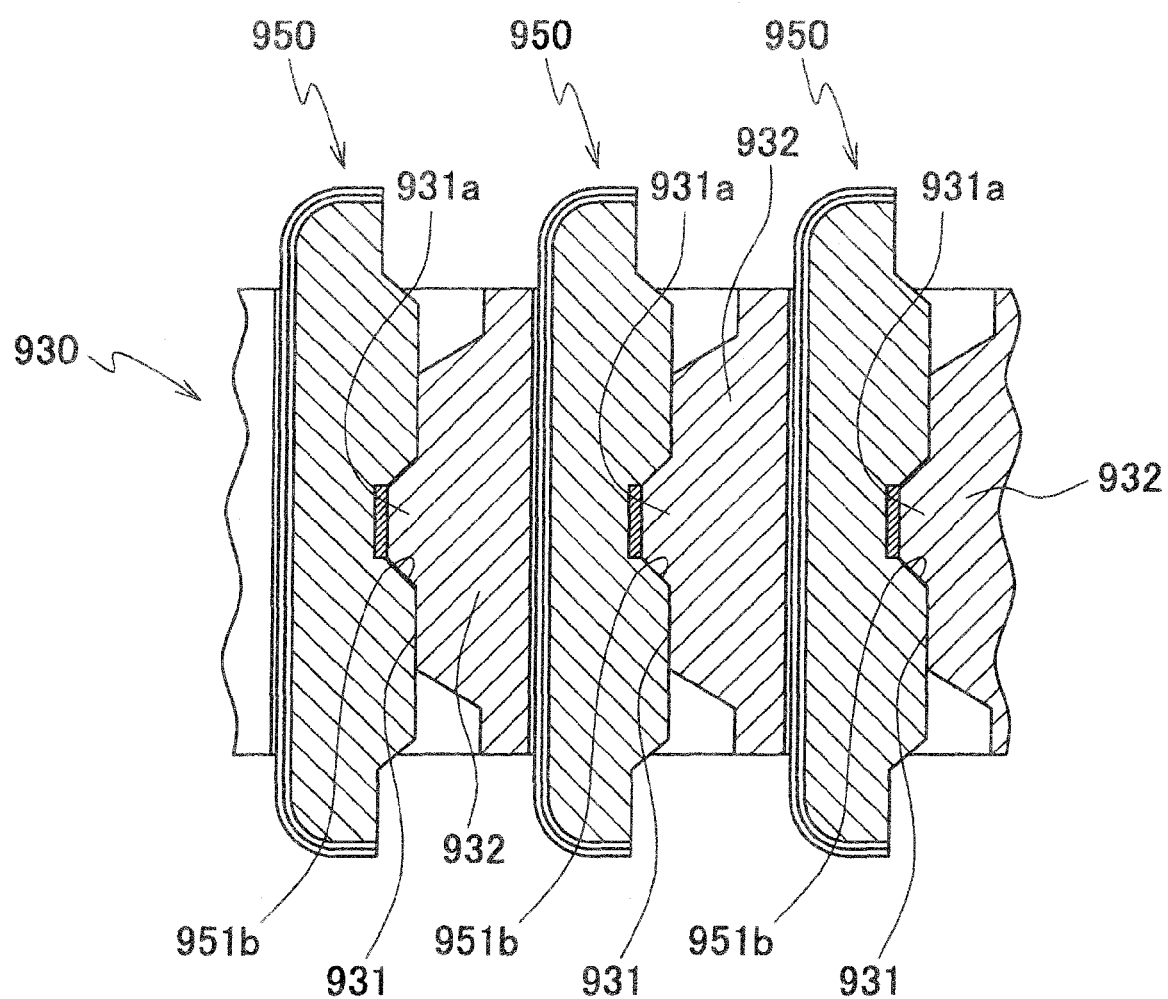
FIG. 33 is a cross-sectional view of the elastic conductors in a state inserted in the slits of the insulating plate of the connector shown in FIG. 30.
Figure 34:
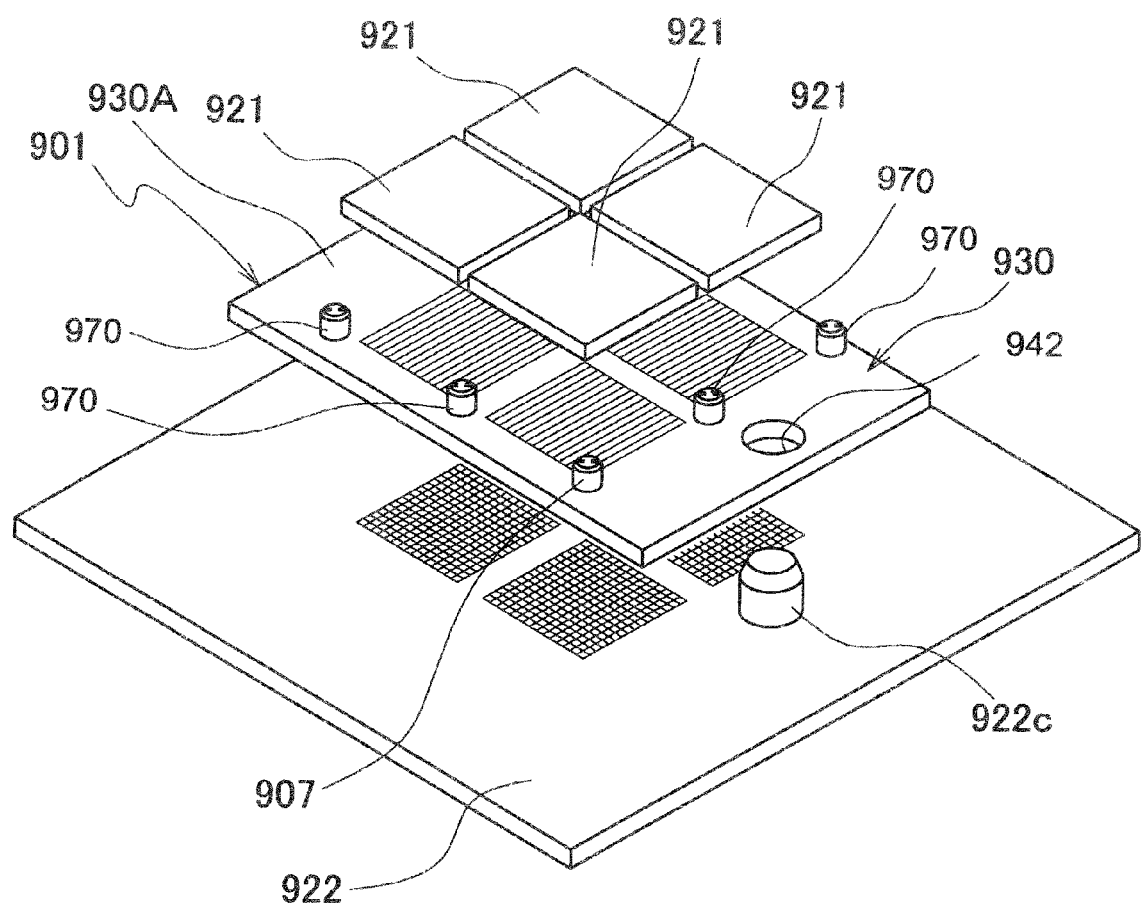
FIG. 34 is a perspective view of the first and second printed boards in a state before being connected using the connector shown in FIG. 30.

The linear core 304 is prism-shaped, and is buried in the insulating elastic members 353 in a manner penetrating through respective central portions of the plurality of insulating elastic members 353 (see FIG. 29A). A front surface and a rear surface of each of portions of the linear core 304 exposed from the insulating elastic members 353 are covered by cover portions 354, respectively (see FIG. 29B). The linear core 304 is higher in rigidity than the wires 61 and 61'. For example, the linear core 304 is a metallic prism having a rectangular cross-section.

Materials of the insulating elastic members 353 and the cover portions 354 include silicon rubber and gel, and the insulating elastic members 353 and the cover portions 354 are formed around the linear core 304 e.g. by outsert molding. The insulating elastic members 353 may be formed by a method other than outsert molding, that is, i.e. by pressing a sheet shaped insulating elastic body, or by cutting a substantially prism-shaped material of the insulating elastic members 353 by laser processing.

The conductive film 351 and the insulating film 352 are bonded to the insulating elastic members 353 except those located at the opposite ends of the linear core 304. By way of another example, the conductive film 351 may be formed directly on the associated insulating elastic member 353 without via the insulating film 352.

According to the third embodiment, it is possible to obtain the same advantageous effects as provided by the first embodiment.

Further, although the insulating frame 8 is employed as the outer frame in the connector 1 according to the first embodiment, and the insulating frame 208 is employed as the outer frame in the connector 201 according to the second embodiment, the outer frame, such as the insulating frame 8 or 208 is not necessarily required, but the connector may be formed only by the two components of the contact member 3 or 303, and the insulating holder 6 or 106.

In the above-described embodiments and variation, as shown in FIGS. 4, 5, 14A, 148, and 14C, the one wire 61 or 161 of each adjacent wires 61 or 161 and 61' or 161' is, as described above, first passed on the first one of the linear cores 4 or 304, from above, and is next passed on the second one of the linear cores 4 or 304 which is adjacent (adjacent in the longitudinal direction Y) to the first linear core 4 or 304, from below, and so on, whereby it is sequentially arranged around all of the linear cores 4 or 304 in a manner alternating between from above and from below in the order of from above and from below. On the other hand, the other wire 61' or 161' of the adjacent wires 61 or 161 and 61' or 161' is first passed on the first one of the linear cores 4 or 304, from below, and is next passed on the second one of the linear cores 4 or 304 which is adjacent (adjacent in the longitudinal direction Y) to the first linear core 4 or 304, from above, and so on, whereby it is sequentially arranged around all of the linear cores 4 or 304 in a manner alternating between from above and from below in the order of from below and from above.

Although the net N is thus formed by arranging the wires 61 or 161, and 61' or 161' alternatingly differently around each linear core 4 or 304, the method of weaving is not limited to this.

Further, although in the above-described embodiments and variation, each wire 61 or 161, and 61' or 161' are passed between each adjacent ones of all of the conductive path portions 5 or 305, this is not limitative, but a plurality of wires 61 or 161, and 61' or 161' may be passed, for example, between each predetermined adjacent ones of the conductive path portions 5 or 305 such that a plurality of conductive path portions 5 or 305 are arranged between the predetermined adjacent ones of the wires 61 or 161, and 61' or 161', which are adjacent in the transverse direction X.

Although in the above-described embodiments and variation, tension is applied to the wires 61 or 161, and 61' or 161' when the resin tapes 62 and the holding portion 162 are bonded (fixed) to the insulating frame 8 or 208, it is not necessarily required to apply tension to the wires 61 or 161, and 61' or 161'.

It is further understood by those skilled in the art that the foregoing are the preferred embodiments of the present invention, and that various changes and modification may be made thereto without departing from the spirit and scope thereof.

What is claimed is:

1. A connector that electrically connects between a first object to be connected and a second object to be connected, comprising:
    an insulating holder including:
    a plurality of linear insulating portions that are arranged parallel to each other, and
    holding portions that hold opposite ends of each of said plurality of linear insulating portions; and
    a plurality of contact members that are sandwiched between the first object to be connected and the second object to be connected and are elastically deformed therebetween, said plurality of contact members being held by said insulating holder,
    each contact member including:
    a linear core that is disposed in a direction orthogonal to a direction in which said linear insulating portions extend; and
    a plurality of conductive path portions provided on said linear core at predetermined spaced intervals, for electrically connecting between first terminal portions formed on the first object to be connected and second terminal portions formed on the second object to be connected, respectively,
    wherein a net is formed by arranging said plurality of linear insulating portions alternatingly differently around said linear core of each contact member.

2. The connector as claimed in claim 1, wherein said linear insulating portions are more flexible than said linear core.

3. The connector as claimed in claim 1, wherein each linear insulating portion is a wire.

4. The connector as claimed in claim 2, wherein each linear insulating portion is a wire.

5. The connector as claimed in claim 3, wherein each linear insulating portion has a substantially circular cross-section.

6. The connector as claimed in claim 4, wherein each linear insulating portion has a substantially circular cross-section.

7. The connector as claimed in claim 1, wherein said plurality of linear insulating portions are formed by blanking a flexible film such that a plurality of slits arranged in parallel to each other are formed therethrough.

8. The connector as claimed in claim 2, wherein said plurality of linear insulating portions are formed by blanking a flexible film such that a plurality of slits arranged in parallel to each other are formed therethrough.

9. The connector as claimed in claim 1, wherein each linear insulating portion extends between adjacent ones of said conductive path portions.

10. The connector as claimed in claim 2, wherein each linear insulating portion extends between adjacent ones of said conductive path portions.

11. The connector as claimed in claim 9, wherein one of said adjacent ones of said linear insulating portions is arranged around all of said linear cores sequentially such that the one is first passed on one of said linear cores, from above, and is next passed on another one of said linear cores adjacent to said one of said linear cores, from below, and the other of said adjacent ones of said linear insulating portions is arranged around said all of said linear cores sequentially such that the other is first passed on said one of said linear cores, from below, and is next passed on said another one of said linear cores adjacent to said one of said linear cores, from above.

12. The connector as claimed in claim 10, wherein one of said adjacent ones of said linear insulating portions is arranged around all of said linear cores sequentially such that the one is first passed on one of said linear cores, from above, and is next passed on another one of said linear cores adjacent to said one of said linear cores, from below, and the other of said adjacent ones of said linear insulating portions is arranged around said all of said linear cores sequentially such that the other is first passed on said one of said linear cores, from below, and is next passed on said another one of said linear cores adjacent to said one of said linear cores, from above.

13. The connector as claimed in claim 1, wherein said conductive path portions are disposed in a manner extending through a mesh of the net.

14. The connector as claimed in claim 2, wherein said conductive path portions are disposed in a manner extending through a mesh of the net.

15. The connector as claimed in claim 1, further comprising an outer frame to which said holding portions are fixed.

16. The connector as claimed in claim 2, further comprising an outer frame to which said holding portions are fixed.

17. The connector as claimed in claim 15, wherein tension is applied to said linear insulating portions.

18. The connector as claimed in claim 16, wherein tension is applied to said linear insulating portions.

* * * * *